United States Patent
Parker et al.

(10) Patent No.: US 6,618,174 B2
(45) Date of Patent: *Sep. 9, 2003

(54) IN-LINE HOLOGRAPHIC MASK FOR MICROMACHINING

(75) Inventors: William P. Parker, Waitsfield, VT (US); Julie W. Parker, Waitsfield, VT (US)

(73) Assignee: Diffraction, LTD, Waitsfield, VT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/972,464

(22) Filed: Nov. 14, 1997

(65) Prior Publication Data

US 2002/0039209 A1 Apr. 4, 2002

Related U.S. Application Data

(60) Provisional application No. 60/030,962, filed on Nov. 15, 1996.

(51) Int. Cl.$^7$ ............................. G02B 5/32; G03F 1/00; B23K 26/06

(52) U.S. Cl. ......................... 359/15; 359/33; 359/900; 430/5; 355/53; 219/121.6; 219/121.7; 219/121.77

(58) Field of Search ........................... 359/32, 33, 566, 359/12, 900; 355/67, 71, 53; 378/34–36; 430/5; 356/457, 458

(56) References Cited

U.S. PATENT DOCUMENTS

3,526,505 A * 9/1970 Kroemer ...................... 359/33
3,533,675 A * 10/1970 Brooks .......................... 359/30

(List continued on next page.)

FOREIGN PATENT DOCUMENTS

| FR | 2669128 A | * | 5/1992 | .................. 359/12 |
| JP | 57-081986 A | * | 5/1982 | |
| JP | 406059615 A | * | 3/1994 | .................. 359/12 |

OTHER PUBLICATIONS

PTO Feb. 1855, Translation of Broussaud, G. (FR 2,669, 128) May 1992, by FLS, Inc.*
IBM Technical Disclosure Bulletin vol. 34, No. 2, "Using Laser and Volume Transmission Holographic Techniques for Ablation and/or Laser Chemical Vapor Deposition Processing of Semiconductor Chips, Wafers, and Substrates", pp. 10–16, Jul. 1991.*
E. Leith and J. Upatnieks, Wavefront Reconstruction with Diffused Illumination and Three–Dimensional Objects, J. Optical Society of America, vol. 54, No. 11, pp. 1295–1301. Nov. 1964.*

(List continued on next page.)

*Primary Examiner*—John Juba, Jr.
(74) *Attorney, Agent, or Firm*—Downs Rachlin Martin PLLC; Thomas N. Neiman; James Marc Leas

(57) ABSTRACT

An optically made, high-efficiency in-line holographic mask (ILHM) for in-line holographic patterning of a workpiece, and apparatus and methods for performing same. The ILHM combines the imaging function of a lens with the transmission properties of a standard amplitude mask, obviating the need for expensive projection optics. The ILHM is either a type I (non-opaque) or type II (opaque) specialized object mask having one or more substantially transparent elements which can be phase-altering, scattering, refracting and/or diffracting. A method of creating a pattern on a workpiece includes the steps of disposing an ILHM, disposing a workpiece adjacent the ILHM and illuminating the ILHM to impart a pattern to the workpiece. In another method, the ILHM is used in combination with a lens. The ILHM is disposed such that a holographic real image is formed at or near the lens object plane, and the workpiece is disposed at or near the lens image plane. Apparatus for patterning a workpiece using an ILHM are also disclosed.

48 Claims, 10 Drawing Sheets

U.S. PATENT DOCUMENTS

| | | | |
|---|---|---|---|
| 3,806,221 A | * 4/1974 | Kiemle | 359/33 |
| 3,957,353 A | * 5/1976 | Fienup et al. | 359/33 |
| 4,530,736 A | * 7/1985 | Mutter | 248/483 |
| 4,668,080 A | 5/1987 | Gale et al. | 355/51 |
| 4,835,088 A | * 5/1989 | Gilson | 359/15 |
| 4,842,969 A | * 6/1989 | Kawatsuki et al. | 430/5 |
| 4,964,698 A | * 10/1990 | Rowlette | |
| 5,142,385 A | 8/1992 | Anderson et al. | 369/10 |
| 5,223,693 A | 6/1993 | Zumoto et al. | 219/121.68 |
| 5,328,785 A | 7/1994 | Smith et al. | 430/5 |
| 5,362,940 A | 11/1994 | MacDonald et al. | 219/121.68 |
| 5,481,407 A | 1/1996 | Smith et al. | 359/742 |
| 5,482,801 A | 1/1996 | Smith et al. | 430/5 |
| 5,501,925 A | 3/1996 | Smith et al. | 430/5 |
| 5,538,817 A | 7/1996 | Smith et al. | 430/5 |
| 5,539,175 A | 7/1996 | Smith et al. | 219/121.7 |
| 5,612,986 A | 3/1997 | Howells et al. | 378/34 |
| 5,705,298 A | * 1/1998 | Knoedl, Jr. | 359/15 |
| 6,008,914 A | * 12/1999 | Sasagawa et al. | 359/15 |

OTHER PUBLICATIONS

Article: "Laser drilling speeds BGA packaging" by Todd Lizotte, Orest Ohar, Terence O'Keefe, Neuman MicroTechnologies, Concord, NH, and Chris Kelly, Solas, Concord, NH, *Solid State Technology,* pp. 120–128, Sep. 1996.

Article: "High–resolution holographic image projection at visible and ultraviolet wavelengths" by I. N. Ross, G. M. Davis, and D. Klemitz, *Applied Optics,* vol. 27, No. 5, pp. 967–972, Mar. 1, 1988.

Article: "Laser Machining with Modulated Zone Plates" by A. Engel, J. Steffen, and G. Herziger, *Applied Optics,* vol. 13, No. 2, pp. 269–273, Feb. 1974.

Article: "Laser Machining with a Holographic Lens" by J. M. Moran, *Applied Optics,* vol. 10, No. 2, pp. 412–415, Feb. 1971.

* cited by examiner

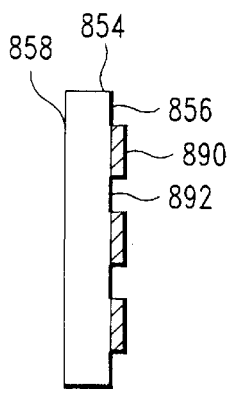 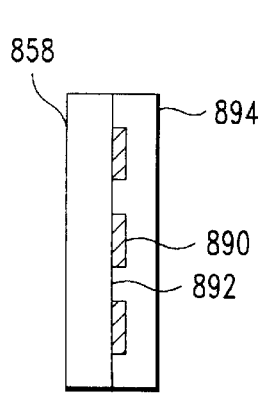 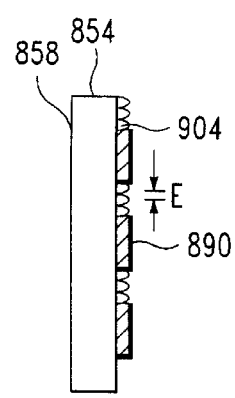 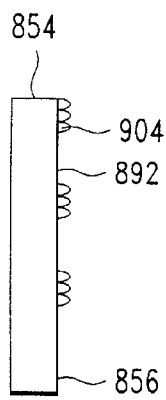
FIG. 17a　　FIG. 17b　　FIG. 17d　　FIG. 17e
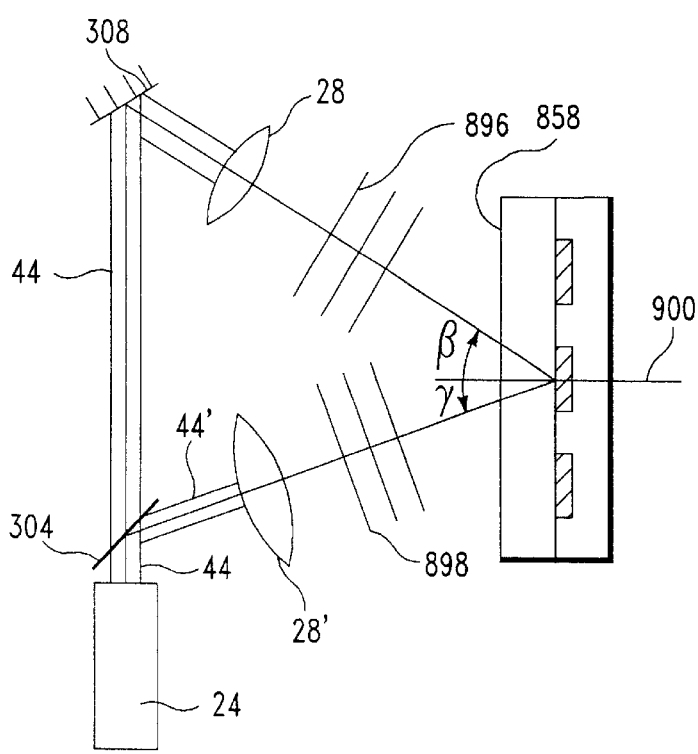
FIG. 17c
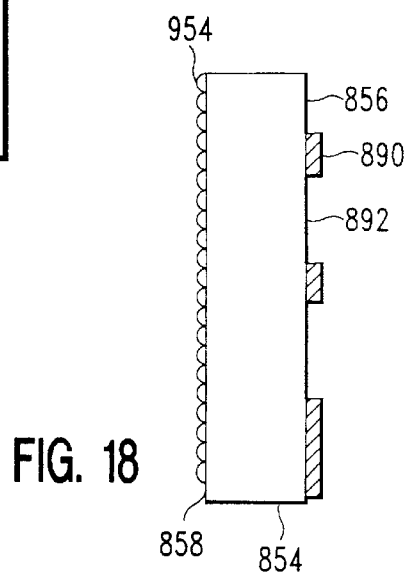
FIG. 18

IN-LINE HOLOGRAPHIC MASK FOR MICROMACHINING

This application claims the benefit of U.S. Provisional Application No. 60/030,962, filed on Nov. 15, 1996.

FIELD OF THE INVENTION

The present invention relates to methods and apparatus for microlithography, photopatterning, machining and materials processing and, more particularly, to high-efficiency in-line holograms that combine the functions of a lens and a standard amplitude mask in one device.

BACKGROUND OF THE INVENTION

There are many industrial applications and processes that require precise patterning of a workpiece, two such applications being, for example, fabricating microcircuits, and forming circuit board interconnections. For instance, the demand for compact electronics packaging has seen the means for forming interconnections among microcircuits evolve from the use of peripheral interconnections (i.e., connections around the edge of the package) to the use of flexible ball grid arrays (BGA) on the surface of the package. This newer BGA packaging and thin, flexible interconnection method requires the creation of an array of hundreds of vias (i.e., holes) on the order of 25 µm diameter in a thin multi-layer laminate insulating layer, such as polyimide (for example, KAPTON polyimide, sold under this trademark by DuPont).

Traditional means for accomplishing precise patterning of a workpiece by micromachining include mechanical drilling, chemical etching, contact printing, and projection photolithography. In recent years, however, lasers have been shown to be a valuable and often preferred means for performing high-precision micromachining because of their directionality, coherence, high intensity and high photon energy.

The specific interaction between the laser beam and the workpiece depends on the laser wavelength and the material comprising the workpiece. For instance, infra-red wavelength and visible wavelength laser beams focused to a small spot on the workpiece provide intense localized heating which vaporizes most workpiece materials. However, such localized heating can have the undesirable side-effect of thermally damaging the workpiece. On the other hand, ultraviolet (UV) wavelength lasers (such as excimer lasers) provide photons with sufficient energy to excite the electrons that form the molecular bonds of certain workpiece materials such as polyimide. Sufficient excitation of the bonding electrons with a tightly focused beam results in the localized disassociation of the material with little or no heating of the workpiece. This process is referred to as "ablation."

In a typical laser-based micromachining application, a laser is used to irradiate the surface of a workpiece in order to form a desired pattern thereon or therein. One method of laser-based micromachining involves a mask-based step-and-repeat operation, wherein the mask is illuminated with a laser beam, and a projection lens images the mask onto the workpiece. While this method is capable of forming small well-defined spots and is well-suited for forming arbitrary shapes or figures, the method is inefficient with its use of available light because the mask blocks a portion of the beam in order to form the pattern. Also, the step-and-repeat method is time-consuming, particularly when hundreds or thousands of spots need to be patterned on each of a multitude of workpieces.

Another method of laser-based micromachining involves scanning a laser beam over the workpiece with a flying-spot scanning apparatus. However, this apparatus is fairly complex and expensive, and is generally not well-suited for forming arbitrary shapes and figures, and it has limited processing capacity or "thruput" (up to about 1000 holes/second) because of its serial mechanical nature.

To increase "thruput" (the number of workpieces that can be processed in a given time interval) and to simplify the apparatus for step-and-repeat laser micromachining, there have been recent efforts to develop laser micromachining methods and apparatus that employ various types of multiple-focusing means for simultaneous drilling multiple holes (i.e., forming holes in "parallel" rather than serially). Such means include conventional lenses, fresnel zone plates (FZP's), computer-generated holograms (CGHs), diffractive optical elements, and binary phase gratings.

Because there is some confusion in the patent literature regarding the definition of the above multiple-focusing means, the following definitions are used herein.

A FZP is a plate with concentric transparent and opaque annular rings or ring sections that transmit and block alternating Fresnel zones on a wavefront thereby allowing the transmitted light to positively interfere and come to a focus. An FZP can also be made with refractive zones instead of opaque zones, so that the phase of the light is changed to be in phase with the other zones, rather than simply being blocked. For FZP's used to create an image other than a single focus spot, the zone pattern is calculated and then produced by digital means and lithography, as is referred to as a "kinoform."

A holographic optical element (HOE) is an optical component used to modify light rays by diffraction, and is produced by recording an interference pattern of two laser beams and can be used in place of lenses or prisms where diffraction rather than refraction is desired.

A hologram is a continuous diffracting region created by two or more interfering beams in which the phase information of the wavefronts in the object is converted to intensity or phase variations. The continuous diffracting region can also be computer-generated. Each point on the hologram contains information about the entire object, and thus any portion of the hologram can, in principle, reproduce the entire three-dimensional image of the object via wavefront reconstruction.

Diffractive optical elements (DOEs) have zones of refraction, phase shift, or amplitude modulation with a scale that allows for the directional control of diffraction effects. A DOE can have a focusing effect as in an FZP, or it can have more complicated effects such as chromatic correction or aspherical distortion correction. Diffracting optical elements are made using computation to describe the zones of diffraction, and then producing these zones in a suitable substrate surface by means of diamond turning or by lithographic processes common to semiconductor manufacturing or injection molding.

A binary optical element is a diffracting optical element having a binary or "flat-top" zone profile.

In addition, the phrase "in-line" as used herein denotes a geometry in which is coaxial, i.e., disposed along a common axis.

Laser micromachining methods and apparatus employing the above multiple-focusing means are generally faster and more efficient than step-and-repeat micromachining, contact printing, and projection photolithography. However, these multiple-focusing apparatus and methods also have their own shortcomings and limitations.

U.S. Pat. No. 5,233,693 to Zumoto et al. discloses an in-line optical projection micromachining apparatus. The apparatus comprises a mask having apertures and reflective parts in between, and a hemispherical reflective member for returning the light reflected off the reflective parts of the mask back toward the open areas of the mask. A projection lens is used to image the mask onto a workpiece. While this system operates in-line, it is fairly complex because the projection lens for most applications would not be a single lens element, but a multi-element well-corrected lens system capable of imaging very small features. In addition, when the mask features to be patterned are small relative to the total area of the mask, the amount of light transmitted by the mask will be relatively low, even with the hemispherical reflective member present.

U.S. Pat. No. 5,481,407 (the '407 patent) to MacDonald et al. discloses a laser-based method and apparatus for creating small holes having a desired shape (e.g., circular, square, oval, etc.) by laser ablation. The focusing means is a segmented array of FZPs, wherein the form of the individual FZPs comprising the segmented array determines the shape of the holes. While this technique allows for a multitude of holes to be patterned simultaneously with a single exposure, it is not well-suited for patterning generalized "non-hole" type objects, i.e., objects having significant physical extent. This is because each FZP in the FZP segmented array is designed to bring light to a small focus at a designated location on the workpiece, rather than to form an image of an extended object on the workpiece. This is disadvantageous because each of the multitude of discrete FZP elements needs to be aligned to a specific location on the workpiece.

Moreover, there are practical shortcomings with the focusing means disclosed in the '407 patent. For instance, the image-forming properties of a segmented lens array are disadvantageous in an industrial environment. Generally, when a workpiece is patterned with a laser micromachining apparatus, material on the workpiece is ejected from the surface during patterning and can become deposited on the image-forming means of the apparatus. When the image-forming means is a lens-type array (e.g., an FZP array), the deposited material can obscure a portion of the array, resulting in a diminution of image quality in the patterns formed by the obscured array lens elements. This problem can be particularly troublesome when the ablated material is transparent, because the deposited material will create a phase error over portions of the lens-type array which is difficult to detect by visual inspection. To prevent ejected material from depositing on the image-forming means, a pellicle or other protective surface can be introduced into the apparatus. However, such modifications make the apparatus more complex and costly.

Also, because the FZPs are discrete, it is difficult to make a mask that will print structures in close proximity.

The publication "Laser Machining with a Holographic Lens," Applied Optics, Vol. 10, No. 2, February 1971 by J. M. Moran discloses the concept of using a hologram illuminated by a laser for machining single and multiple spots on a workpiece. Using a hologram as a mask is advantageous in that it can have multiple-focal distances because of the three-dimensional nature of the holographic image. A hologram also has the advantage of being able to create not only sharply focused points, but extended images which can be patterned into or onto a workpiece. Moreover, there is no need to compute an "array" of segmented areas to achieve repetitive patterning, as a hologram can comprise a substantially continuous diffracting region recording of the wavefronts from disparate features on an object. In other words, a hologram is not a segmented array. Rather, each portion (or, alternatively, large portions) of the hologram contributes to the creation of the image formed. Indeed, a hologram can be cut into pieces, with each piece being capable of reproducing, in toto, the entire image (albeit from a limited set of angles). This property makes holograms very advantageous over discrete arrays of focusing elements because if part of the hologram is obscured by for example material ejected from the workpiece, the first-order net effect of the obscuration is a diminution in the overall intensity of the entire image, rather than the loss of resolution of the individual sub-images.

While the hologram in the above-cited publication has the above-mentioned advantages, it is used off-axis, meaning that the illuminating beam, hologram, and workpiece are not in-line. An in-line geometry is preferred for most manufacturing applications, as the apparatus is simpler to fabricate and less costly than an off-axis apparatus. Also, the method of patterning with an in-line apparatus is less complex, as precise alignment between the workpiece and the hologram is more easily achieved. Moreover, an in-line geometry allows for the hologram to be "replayed" with a beam having a wavelength different from the wavelength used in its construction with minimal impact on aberrations. In addition, some manufacturing processes require an in-line geometry because of the geometry of the existing installed base of expensive manufacturing apparatus. Also, for many applications, e.g., drilling vias for microcircuit interconnections, the vias must have an axis perpendicular to the surface of the workpiece in order for the various layers of the microcircuit to be properly interconnected.

U.S. Pat. No. 5,612,986 to Howells et at. (the '986 patent) discloses a method of performing X-ray lithography using holographic images from a computer-generated on-axis hologram. However, the method disclosed in the '986 patent requires a computer-generated hologram (which restricts the types of images the hologram can form and is computationally intensive), is only for forming images smaller than 0.25 $\mu$m, and apparently only works at X-ray wavelengths.

U.S. Pat. No. 4,668,080 to Gale et al. (the '080 patent) discloses an apparatus for forming a periodic pattern in a layer of photosensitive material, the apparatus comprising a lenticular array of lenslets and a means for scanning a beam of light sequentially through each lenslet in the array. The '080 patent also discloses an apparatus where the lenslets in the lenticular array are holograms, and where the array of holograms is sequentially scanned by a light beam scanning means.

The publication "High-resolution image projection at visible and ultraviolet wavelengths," by I. N. Ross et al., Applied Optics, Vol. 27, No. 5, pg. 967 (Mar. 1, 1988) discusses the construction of a holographic test mask having resolution test-patterns recorded therein, and then patterning the test-patterns in photoresist by illuminating the holographic test mask with a laser. While this technique exploits the aforementioned advantages of a hologram, the recording of the hologram and subsequent patterning steps are accomplished off-axis.

The publication "Photosensitized polystyrene as a high-efficiency relief hologram medium," by F. M. Schellenberg et al., SPIE Vol. 1051 Practical Holography III (1989), discloses using holograms off-axis for photoablation using high-powered lasers. The holograms were reflection holograms formed in t-BOC, a plastic material with limited damage threshold to deep ultra-violet wavelengths.

The publication "A technique for projection x-ray lithography using computer-generated holograms" by C. Jacobsen and M. R. Howells, J. App. Phys. 71 (6) 15 March 1992, discusses a holographic approach to x-ray projection lithography using an in-line hologram generated by computer. However, this publication only provides computer simulations of the imaging and contemplates an in-line CGH, which is time-consuming. Indeed, while the theoretical aspects of in-line holograms have been explored, the actual fabrication of in-line holographic masks for practical industrial use is truly daunting. The fact that persons skilled in the art of holography have not, to date, actually optically fabricated and used an in-line holographic mask suitable for micromachining in an industrial environment is testimony to the difficulty involved in applying in-line holographic methods to an industrial environment.

Therefore, there exists a need for high-efficiency optically fabricated in-line holograms suitable for industrial use from the infra-red to the deep ultra-violet region of the electromagnetic radiation spectrum for patterning a workpiece.

SUMMARY OF THE INVENTION

The present invention is an optically made, high-efficiency in-line holographic mask (ILHM) for in-line holographic patterning of a workpiece, and apparatus and methods for performing same. The ILHM of the present invention combines the imaging function of a lens with the transmission properties of a standard amplitude mask, obviating the need for expensive projection optics. In forming the ILHM, two types of object masks are used: type I object masks, which are non-opaque except for one or more substantially transparent elements, and type II object masks, which are substantially opaque except for one or more substantially transparent elements. The one or more substantially transparent elements can be phase-altering, scattering, refracting or diffracting. The present invention has application for wavelengths ranging from the infra-red (IR) to the x-ray region of the electromagnetic radiation spectrum.

In one aspect of the invention, an ILHM for patterning a workpiece is formed by a process comprising the steps of providing an illumination source for generating a coherent illumination beam directed along an axis, and then providing a non-opaque object mask (i.e., a type I object mask) having a semi-transparent layer with an optical density between 0.1 and 5 and one or more substantially transparent elements for creating object wavefronts when the illumination beam is incident thereon. Next, the object mask is disposed in the illumination beam, and a holographic recording medium is provided in the illumination beam adjacent the object mask. The next step involves illuminating the object mask with said illumination beam, thereby causing the object mask to allow undiffracted reference wavefronts to pass therethrough, and also causing the one or more transparent elements to create object overlapping wavefronts which interact with the undiffracted reference wavefronts to create an interference pattern. The preferred beam ratio (intensity) between the reference wavefronts and the object wavefronts is from 0.1:1 to 100:1. Finally, the interference pattern is recorded in the holographic recording medium so as to create a substantially continuous diffracting region.

In another aspect of the present invention, an ILHM capable of patterning a workpiece is formed by a process comprising the steps of providing an illumination source for generating a coherent illumination beam directed along an axis, then providing a substantially opaque object mask (i.e., a type II object mask) having one or more substantially transparent elements for creating object wavefronts when the illumination beam is incident thereon. Next, the object mask is disposed in the illumination beam, and a holographic recording medium is provided in the illumination beam adjacent the object mask. The next step involves illuminating the object mask with the illumination beam, thereby causing the one or more elements to create overlapping object wavefronts. Next, a reference beam is provided that is coherent with the illumination beam and that has reference wavefronts that are in-line with the object wavefronts and that interact with said object wavefronts so as to create an interference pattern. The preferred beam ratio between the reference wavefronts and the object wavefronts is from 0.1:1 to 100:1. Finally, the interference pattern is recorded in the holographic recording medium so as to create a substantially continuous diffracting region.

Another aspect of the present invention is a method of creating a pattern on a workpiece comprising the steps of providing a source of illumination for generating a reconstruction beam having a reconstruction beam wavelength and extending along an axis. Next, an in-line holographic mask that creates a holographic image corresponding to a pattern when illuminated with said reconstruction beam is disposed on the axis. Next, a workpiece is disposed on the axis adjacent the in-line holographic mask. Finally, the in-line holographic mask is illuminated with the reconstruction beam so as to form the holographic image on the workpiece and impart the pattern to the workpiece.

A further aspect of the present invention is a method of patterning a workpiece using an ILHM whereby the wavelength of light used to construct the ILHM is different from the wavelength of light used to pattern the workpiece.

Another aspect of the present invention is an apparatus for patterning a workpiece comprising a source of illumination for generating a reconstruction beam extending along an axis, an in-line holographic mask disposed on the axis adjacent the source of illumination, and a workpiece holder disposed on the axis adjacent the in-line holographic mask.

An additional aspect of the present invention is an apparatus for patterning a workpiece, comprising a source of illumination, a workpiece holder, a lens having an object plane and an image plane and an in-line holographic mask capable of forming a real image. The lens is disposed between the source of illumination and the workpiece holder, the mask is disposed between the source of illumination and the lens. The lens then relays the real image to be at or near the workpiece holder.

BRIEF DESCRIPTION OF THE DRAWINGS

FIG. 17a is a cross-sectional view of a transparent object mask substrate having an opaque layer with apertures formed therein;

FIG. 17b is a cross-sectional view of the object mask substrate of FIG. 17a, with a layer of negative photoresist deposited atop the opaque layer and in the apertures;

FIG. 17c is a cross-sectional view of the object mask substrate of FIG. 17b in an apparatus for providing two interfering plane wave beams that interfere within the negative photoresist layer to form a grating (not shown) within the apertures;

FIG. 17d is a cross-sectional view of the object mask substrate of FIG. 17c after the negative photoresist layer is developed and shows a negative photoresist grating formed within the apertures, thereby resulting in a type II grating mask;

FIG. 17e is a cross-sectional view of the object mask of FIG. 17d, but with the opaque layer removed to form a type I diffracting object mask; and FIG. 18 is a side-view of a diffracting object mask wherein a grating is formed on the back side of the substrate.

DETAILED DESCRIPTION OF THE INVENTION

Figure 1:
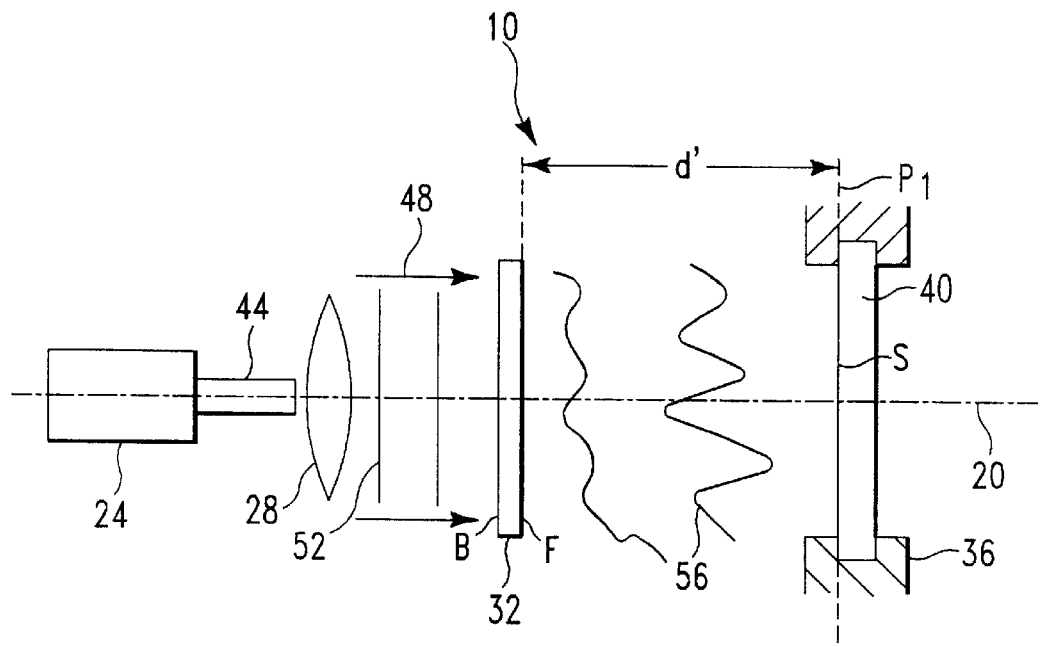
FIG. 1 is a schematic side view of an apparatus for patterning a workpiece using an ILHM of the present invention.

The present invention is an optically made, high-efficiency in-line holographic mask (ILHM) for in-line holographic patterning of a workpiece and apparatus and methods for performing same. The ILHM of the present invention combines the imaging function of a lens with the transmission properties of a standard amplitude mask, obviating the need for expensive projection optics. Because the ILHM of the present invention is optically made (as opposed to computer generated), a wide variety of features of varying complexity can readily be patterned on a workpiece. Further, the ILHM is not limited to discrete phase or transmission values as an approximation to the holographic interference pattern, but contains a wide range of phase information present in the diffracted wavefronts from a real object. Further, it will be understood that the present invention has application for wavelengths ranging from the IR to the x-ray region of the electromagnetic radiation spectrum.

For applications in the DUV and UV wavelengths, materials such as fused silica, calcium fluoride and lithium flouride may be employed. For applications in the IR, materials such as germanium, silicon, zinc selenite or zinc sulfide may be employed. For applications in the visible wavelength, any number of well-known optical quality glasses may be employed, such as quartz or Bk-7. For applications in the x-ray region, materials such as diamond, mylar or beryllium may be employed. These materials are substantially transparent and resistent to damage at the given wavelengths, even for high fluence.

In the present invention, the term "high efficiency" refers to an ILHM's ability to redirect a high percentage of a beam of light normally incident the ILHM, thereby forming a real image of sufficient intensity to pattern a workpiece disposed coaxial with and adjacent the ILHM and opposite the coherent beam. Also, as used herein, the phrase "patterning a workpiece" is a general way of describing a multitude of industrial applications of the present invention, such as drilling holes or other features by photoablation to form interconnects in microcircuits, or for forming apertures in thin membranes (e.g., ink-jet cartridge membranes), and the like. To facilitate patterning of the workpiece, a layer of light-sensitive material may be employed.

The theory and operation of holograms is described in the book "Optical Holography" by R. Collier, C. Burckhardt, and L. Lin, published by Academic Press, Inc., San Diego, Calif. 92101 (ISBN 0-12-181052-6). Briefly, a hologram is a substantially continuous diffracting region created by recording, in a light-sensitive recording medium, the interference pattern created by two coherent light beams: a first light beam (referred to herein as the "illumination beam") comprised of coherent wavefronts that scatter or diffract from an object, resulting in an "object beam" having "object wavefronts," and a second "reference beam" comprised of coherent "reference wavefronts," also coherent with the object wavefronts. The diffraction region is described as being "substantially continuous" because the recording medium will generally not be able to record the full range of intensities incident thereon. Thus, there results a small amount of discontinuity in the interference pattern due to the limited sensitivity of the recording medium.

Typically, the object reference beams originate from the illumination beam, so that coherence between the beams is readily achieved. The reference beam (usually comprised of plane-waves, but not necessarily so) allows phase and amplitude information contained in the object wavefronts to be preserved in the recording medium. This is achieved by converting the phase information contained in the object wavefronts into amplitude variations in the form of a complex interference pattern formed in the recording medium. Generally, when two wavefronts with amplitudes $A_1(x,y)$ and $A_2(x,y)$ interfere, the overall irradiance distribution $I(x,y)$ is given by $I(x,y)=|A_1+A_2|^2=A_1^2+A_2^2+2RE\{A_1A_2^*\}$. The term $2RE\{A_1A_2^*\}$ (where "RE" denotes "the real part of") represents the overlap of the two amplitudes and is the "interference term." The hologram may be constructed by simultaneously exposing the entire object with the illumination beam and the entire recording medium with the reference beam. Alternatively, the illumination beam may scan the object while the reference beam simultaneously scans the recording medium.

Once a hologram is formed or "constructed," the object recorded therein is "reconstructed" or "replayed" by illuminating the hologram with a second coherent beam, called the "reconstruction" beam, usually of the same wavelength, and usually with wavefronts that are "conjugate" (the reverse wavefront and direction) to the wavefronts in the reference beam. For a plane-wave reference beam described by the equation $R(x)=A_0\exp[ikx]$, where $A_0$ is a constant amplitude factor, $k=2\pi/\lambda$ (lambda being the wavelength of the reference light beam), and x is the distance along an x-axis, the conjugate beam is the complex conjugate of $R(x)$, written as $R^*(x)=A_0\exp[-ikx]$.

When the hologram is illuminated with a reconstruction beam that is identical to the reference beam, the substantially continuous diffracting region imparts a wavefront onto the reconstruction beam that is identical to the object wavefronts. The result is that the object wavefronts appear to be "released" from the hologram as they propagate away from a point where the object was originally located, thereby forming a three-dimensional "virtual" image.

When the hologram is illuminated with a reconstruction beam that is the conjugate of the reference beam, the substantially continuous diffracting region imparts a wavefront onto the reconstruction beam that is identical to the conjugate of the object wavefronts. The result is that the object wavefronts appear to be released from the hologram in "reverse," resulting in the original object being "reconstructed" as a three-dimensional real image in space. It is this real image that is usable for patterning a workpiece.

For producing a real image from an in-line hologram, there is no difference, in theory, whether the reconstruction beam is identical to or conjugate to the illumination beam. However, for the sake of convention, the reconstruction beam in the present invention is shown as being conjugate to the illumination beam. One way this is achieved with an in-line hologram is by inserting the hologram into the reconstruction beam with its backside facing the beam.

It is important to note that multiple holograms can be recorded in a single holographic recording medium. The superimposed holograms, upon reconstruction, will form independent real images. These images can be displaced spatially from one another to create a particularized three dimensional irradiance distribution.

Apparatus for Patterning a Workpiece Using an ILHM

FIG. 1 is a schematic side view of an apparatus 10 for patterning a workpiece using an ILHM. The apparatus 10 includes the following elements, all disposed coaxially along axis 20: a source of illumination 24, beam expanding and collimating optics 28, an ILHM 32 with front surface F and back surface B, a workpiece holder 36 capable of holding a workpiece 40, the workpiece as shown having a front surface S disposed in a plane P1 a distance d' from front surface F of ILHM 32. ILHM 32 has a substantially continuous diffraction region, as discussed in more detail below. Also shown in the Figure is a light beam 44 (i.e., a beam of wavefronts) emanating from source of illumination 24, reconstruction beam 48 with reconstruction wavefronts 52, and diffracted wavefronts 56.

Source of illumination 24 may be, for example, a coherent light source, such as a laser, for example a Krypton-ion laser, which operates at a wavelength of 413 nm, or an Excimer laser operating at 248 nm or 193 nm. While it is preferred that source of illumination 24 be coherent, in practice perfect coherence is unattainable and also sometimes not desirable. Also, it will often be preferred that source of illumination 24 be only "substantially" coherent. It will be understood that the word "coherent" as used herein encompasses "substantially coherent," which is how the term is used in practice by those skilled in the art of holography. Moreover, it will be understood that for the present invention source of illumination 24 can have a wavelength ranging from the IR through the DUV region of the radiation spectrum.

Beam expanding and collimating optics 28 are used to increase the size of light beam 44 so as to be of a suitable dimension relative to ILHM 32 and workpiece 40, to filter undesirable high spatial frequencies thereby increasing beam uniformity, and to collimate light beam 44 after it is expanded, thereby forming reconstruction beam 48. Beam expanding and collimating optics 28 may include, for example, a first converging lens, a spatial filter (i.e., a small axial aperture) and a second converging lens (none shown). It will be appreciated by one skilled in the art that any one of a number of optical systems can serve as beam expanding and collimating optics 28.

A collimated beam, by definition, has planar wavefronts that are perpendicular to their direction of propagation. In the embodiment of apparatus 10 of FIG. 1, reconstruction beam 48 is shown to be collimated and comprised of reconstruction wavefronts 52 that are planar and perpendicular to optical axis 20.

It will be appreciated by those persons skilled in the art that in making ILHM 32 and then reconstructing or "replaying" it, the illumination and reconstruction beams need not consist of plane waves. In fact, it will often be preferable in practice to determine beforehand the exact form of the wavefronts of the reconstruction beam to be used and, in anticipation, tailor the reference beam wavefronts to be the conjugate of the reconstruction beam wavefronts. This eliminates (or significantly reduces) aberrations induced by a mismatch between the wavefronts in the reference and reconstruction beams. For the sake of simplicity, the discussion hereinafter presumes and the accompanying Figures show the illumination reference and reconstruction beams to consist of plane waves.

With continuing reference to FIG. 1, ILHM 32 is disposed in apparatus 10 with back surface B facing reconstruction beam 48. This is so that reconstruction beam 48 is "conjugate" relative to ILHM 32, assuming the collimated reference beam used in making ILHM 32 was incident front surface F. Patterning of workpiece 40 is achieved by illuminating ILHM 32 at normal incidence with reconstruction beam 48, whereupon the substantially continuous diffracting region that constitutes ILHM 32 transforms reconstruction wavefronts 52 into diffracted wavefronts 56, which converge at surface S of workpiece 40 to form a real image of sufficient intensity and definition (e.g., substantially free of diffraction artifacts) to precisely pattern workpiece 40.

One of the main advantages of in-line patterning of a workpiece using ILHM 32 of the present invention is that the wavelength of the light used to construct the ILHM 32 and to pattern a workpiece using the ILHM 32 need not be the same. This is because an ILHM 32 has the property that using a reconstruction beam with a different wavelength than that of the illumination beam results only in an axial displacement of the real image and does not introduce significant aberrations. If, when constructing an ILHM 32, the distance between the object and the recording medium is d and the wavelength of the illumination (i.e., construction) and reference beams is $\lambda_1$, then replaying the ILHM 32 with a reconstruction beam wavelength of $\lambda_2$ results in a real image being formed at a distance d'=$[\lambda_1/\lambda_2]$d from the ILHM 32. This property is advantageous because it allows for ILHM 32 to be formed at a wavelength best suited for making a hologram (e.g., perhaps visible light from a Helium-Neon laser at 633 nm, an Argon-ion laser at 513 nm, or a Krypton-ion laser 413 nm), and then patterning the workpiece using a wavelength best suited for ablating a particular workpiece material (e.g., UV light from an excimer laser at 248 nm to ablate photoresist or thin plastic or a frequency doubled diode pumped laser at 355 nm or 266 nm to ablate polyimide). For example, in the present invention, in one experiment, the spacing d is set at 60 millimeters (mm) in fabricating an ILHM 32 with an illumination and reference beam wavelength of $\lambda_1$=413 nm. ILHM 32 is then used in apparatus 10 of FIG. 1 to pattern a workpiece disposed at a distance d'=100 mm from the ILHM 32, using a reconstruction beam wavelength $\lambda_2$=248 nm.

Apparatus and Processes for Forming an ILHM

The process for forming ILHM 32 depends on the type of object used. In the present invention, the object is a specialized "object mask," i.e., a planar substrate (substantially transparent, semi-transparent or opaque) having one or more specially designed elements corresponding to (but not necessarily identical to) the feature or features to be patterned on a workpiece. In fact, as will be seen below, the one or more specialized elements on the object mask are designed to create object wavefronts arising from light passing through the one or more elements and being dispersed by the process of either phase-alteration, scattering, refraction, or diffraction, or a combination thereof, which ultimately results in a large interference term in the interference pattern recorded in the ILHM 32.

Generally speaking, there are two types of specialized object masks used in the present invention to form ILHM 32: (i) object masks that are otherwise substantially transparent or semi-transparent and that have one or more substantially transparent phase-altering, scattering, refracting, or diffracting elements. These object masks are capable of transmitting a sufficient portion of the illumination beam to serve as a reference beam are referred to hereinafter as "type I" object masks; and (ii) object masks that are substantially opaque and that have one or more substantially transparent phase-altering, scattering, refracting, or diffracting elements. These object masks do not transmit a reference beam and are referred to hereinafter as "type II" object masks. In other words, a type II object mask is the same as a type I object mask, with the exception that a type II object mask does not transmit a sufficient portion of the illumination beam to serve as a reference beam.

With type I object masks, a precise balance of intensities of the object wavefronts and the reference wavefronts is required to obtain a sufficiently large interference term. One method of achieving this balance is to provide the type I object mask with a semi-transparent layer of material, such as a thin layer of metal or dyed polymer, that covers the object mask in the area not covered by the one or more object mask elements. This semi-transparent layer serves to attenuate the transmitted illumination beam, thereby providing a desired intensity balance between the object wavefronts and reference wavefronts. For the type I object masks of the present invention, a dark chrome layer having an optical density in the range (logarithmic) of 0.1 to 5.0 provides the proper substrate transmission to properly balance the diffracted object and reference wavefront intensities. Preferred values for the beam ratio (reference beam to object beam) are from 0.1:1 to 100:1. The precise value of the optical density for the semi-transparent material to achieve a desired beam ratio will depend on the number, and shape, of the mask elements and is best determined by trial and error.

With type II object masks, an in-line reference beam is not readily available via partial transmission of the illumination beam through the object mask. However, an in-line reference beam is provided by directing a portion of the illumination beam around the object mask, and then bringing it back in-line with the original illumination beam. In this arrangement, filters can be used to obtain the proper beam ratio in the range set forth above. A detailed description of several type I and type II specialized object masks, along with the process steps for forming them and using them in constructing an ILHM 32 according to the present invention is provided below.

Using a Type I Object Mask

Figure 2:
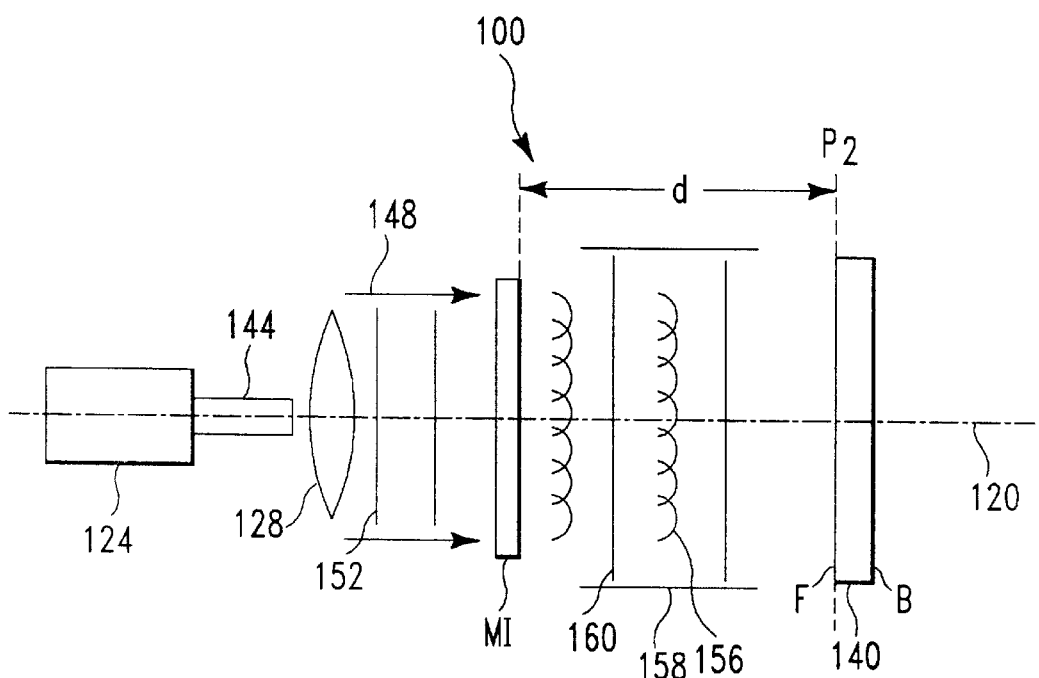
FIG. 2 is a schematic side view of an apparatus for forming an ILHM of the present invention using a type I object mask.

FIG. 2 is a schematic side view of an apparatus 100 for forming an ILHM 32 using a type I object mask according to the present invention. Apparatus 100 is similar to apparatus 10 of FIG. 1, and includes the following elements, all disposed coaxially along axis 120: a source of coherent illumination 124, beam expanding and collimating optics 128, a type I object mask MI, and a holographic recording medium (hereinafter, simply "recording medium") 140 with front surface F and back surface B, wherein front surface F is disposed in a plane P2 distance d from the surface of object mask MI closest to recording medium 140. The distance d in apparatus 100 will be the same as the distance d' in apparatus 10 (see FIG. 1) when the wavelength of coherent source of illumination 24 and source of coherent illumination 124 are the same.

Also shown in FIG. 2 is a coherent beam 144 emanating from source of coherent illumination 124, illumination beam 148 with illumination wavefronts 152, overlapping object wavefronts 156, and reference beam 158 having reference wavefronts 160. Reference wavefronts 160 are the illumination wavefronts 152 that pass through object mask MI attenuated but otherwise unaltered. Overlapping object wavefronts 156 arise from the phase-alteration, scattering, refraction, or diffraction of illumination wavefronts 152 by the one or more elements (not shown) on the "object," i.e., object mask MI. Recording medium 140 may be photoresist, photopolymer, silver-halide emulsion, or any other light-sensitive medium known to be suitable for recording a hologram at the particular wavelength of the illumination beam.

With continuing reference to FIG. 2, in a preferred embodiment of the present invention, an ILHM 32 is formed using a type I object mask in apparatus 100 by a process comprising the steps of (a) providing coherent illumination beam 148 directed along axis 120; (b) providing a type I object mask; (c) inserting the type I object mask within coherent illumination beam 148; (d) providing recording medium 140 adjacent object mask MI opposite source of coherent illumination 124; (e) illuminating object mask MI with illumination beam 148, thereby creating overlapping object wavefronts 156 and reference wavefronts 160; and (f) recording, in the recording medium a substantially continuous diffracting region comprising the interference pattern created by overlapping object wavefronts 156 and reference wavefronts 160. The process for recording the ILHM 32 is described in more detail below.

Using a Type II Object Mask

Figure 3:
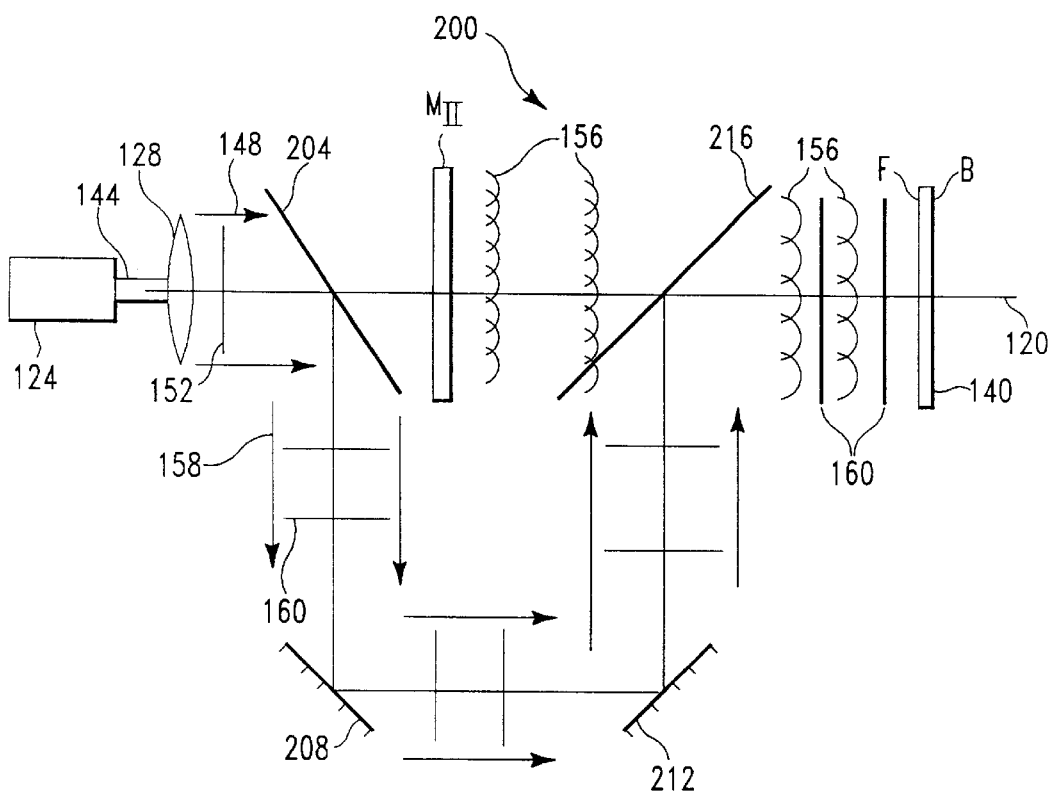
FIG. 3 is a schematic side view of an apparatus for forming an ILHM of the present invention using a type II object mask.

FIG. 3 is a schematic side view of an apparatus 200 for forming an ILHM 32 using a type II object mask MII according to the present invention. Apparatus 200 comprises all the elements of apparatus 100 of FIG. 2, except that type I object mask MI is replaced with type II object mask MII. Apparatus 200 further includes a first beamsplitter 204, a first mirror 208, a second mirror 212, and a second beamsplitter 216. First beamsplitter 204 is disposed along axis 120 immediately adjacent beam expanding and collimating optics 128 and opposite source of coherent illumination 124, and diverts a portion of illumination beam 148 from axis 120 to create a reference beam 158 having reference wavefronts 160. Reference beam 158 circumvents object mask MII by being reflected by mirror 208, which reflects reference beam 158 to mirror 212, which in turn reflects reference beam 158 toward second beamsplitter 216. Second beamsplitter 216 is disposed between object mask MII and a recording medium 140 and is oriented such that it acts as a beam combiner by directing reference beam 158 along axis 120 towards recording medium 140 so that reference wavefronts 160 are in-line with object wavefronts 156.

Beamsplitters 204 and 216 may each be for example, a pellicle or plate beamsplitter with a reflective coating tuned to the wavelength of coherent source of illumination 124. Alternatively, beamsplitters 204 and 216 may be large beamsplitting cubes, or such other beamsplitting and beam combining apparatus or techniques that are well-known in the art.

Figure 4:
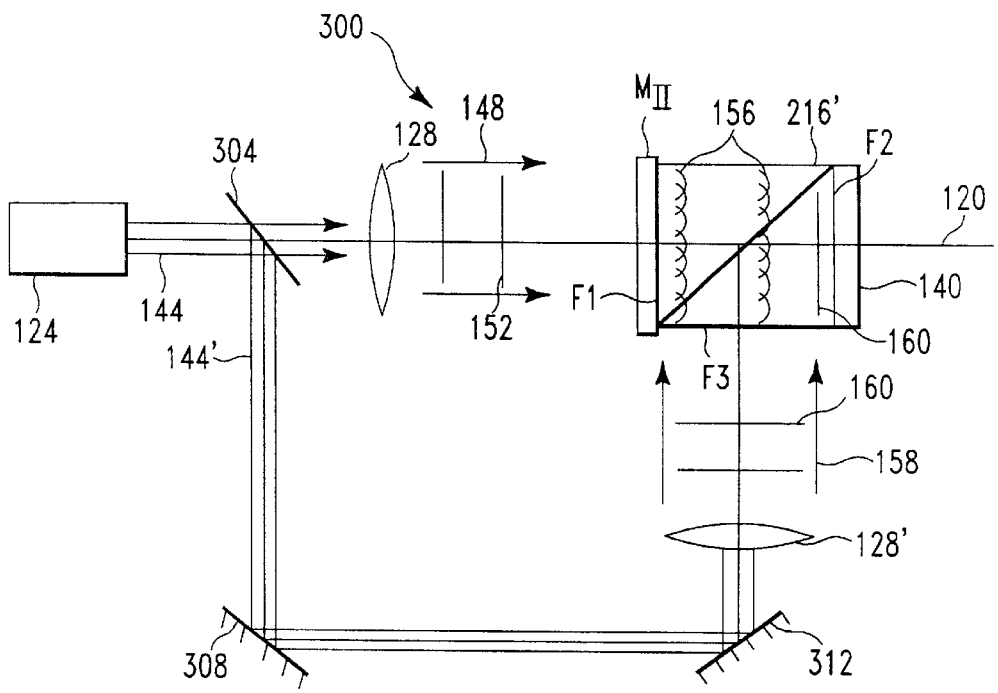
FIG. 4 is a schematic side view of an apparatus similar to the apparatus of FIG. 3 except that it employs a beamsplitting cube as a beam combiner.

FIG. 4 is a schematic side view of an alternate apparatus 300, similar to apparatus 200, for forming an ILHM 32 according to the present invention, but that employs a beamsplitting cube 216' as a beam combiner. Beamsplitting cube 216' is useful for minimizing spurious interference fringes, or "noise" in the ILHM 32 caused by reflections from interfaces within apparatus 300, or by mechanical vibration. Apparatus 300 comprises the elements of apparatus 100 in FIG. 2, and further includes a first beamsplitter 304, disposed in coherent beam 144, which creates a second coherent beam 144'. Second coherent beam 144' reflects off first and second mirrors 308 and 312 and passes through a second beam expanding and collimating optics 128', thereby forming a reference beam 158. This arrangement could also be used in apparatus 200 shown in FIG. 3. Reference beam 158 is then directed to beamsplitter cube 216', which acts as a beam combiner by directing reference beam 158 to be in-line with optical axis 120.

Illumination of object mask MII with illumination beam 148 results in the creation of overlapping object wavefronts 156. Overlapping object wavefronts 156 pass directly through beamsplitting cube 216' and are combined therein with in-line reference wavefronts 160 in reference beam 158. The resulting interference pattern is recorded in recording medium 140 as an ILHM 32, as described above.

Beamsplitting cube 216' includes faces F1, F2 and F3 that are substantially the size of object mask MII and recording medium 140. In a preferred embodiment, object mask MII and recording medium 140 are in contact with and index-matched to faces F1 and F2, respectively, of beamsplitting cube 216'. Index matching between object mask MII and beamsplitting cube 216' and/or beamsplitting cube 216' and recording medium 140 may be achieved using a suitable adhesive or fluid (e.g., epoxy or index-matching oil) as a temporary mount. In addition, faces F1 through F3 of beamsplitting cube 216' may have an anti-reflection coating to enhance transmission of light therethrough.

One of the main advantages of using apparatus 200 or 300 to form an ILHM 32 is that reference beam 158, though ultimately in-line, can be adjusted in intensity while directed off axis from axis 120 to provide the precise intensity balance between illumination beam 148 and reference beam 158 necessary to maximize the efficiency of the ILHM 32.

With reference to apparatus 200 of FIG. 3 or apparatus 300 of FIG. 4, in a preferred embodiment of the present invention, an ILHM 32 is constructed by a process comprising the steps of: (a) providing illumination beam 148 directed along axis 120; (b) providing a type II object mask MII; (c) disposing object mask MII within illumination beam 148; (d) providing a recording medium 140 adjacent object mask MII and opposite source of coherent illumination 124; (e) illuminating object mask MII at normal incidence with illumination beam 148, thereby creating overlapping object wavefronts 156; (f) simultaneous with step (e), directing portion 144' of coherent beam 144 around object mask MII using, for example, mirrors and beamsplitters, thereby forming in-line reference beam 158 having reference wavefronts 160 that are in-line with overlapping object wavefronts 156 (and thus normally incident recording medium 140); and (g) recording, in recording medium 140, an ILHM 32 having a substantially continuous diffracting region comprising the interference pattern created by overlapping object wavefronts 156 and reference wavefronts 160. The manner in which this substantially continuous diffracting region is formed will be more apparent following the more detailed description of masks MI an MII, provided below. The process for recording ILHM 32 in recording medium 140 is also described in more detail below.

Figure 5A:
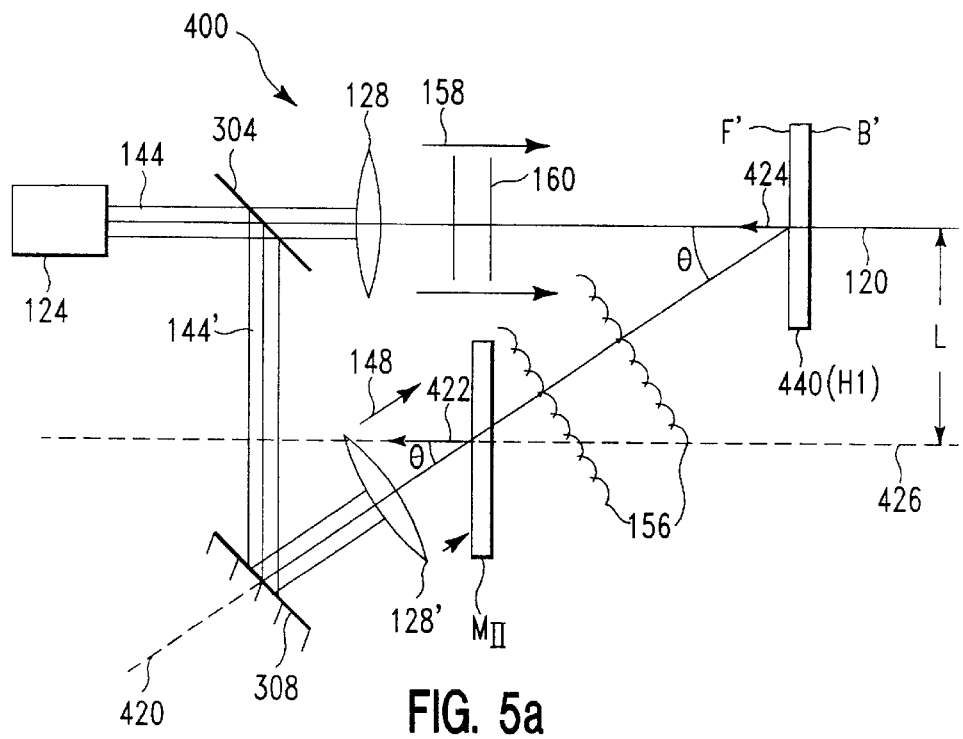
FIG. 5a is a schematic side view of a first apparatus for forming a hologram H1 of a type II object mask as part of a first two-step process for forming an ILHM of the present invention.
Figure 5B:
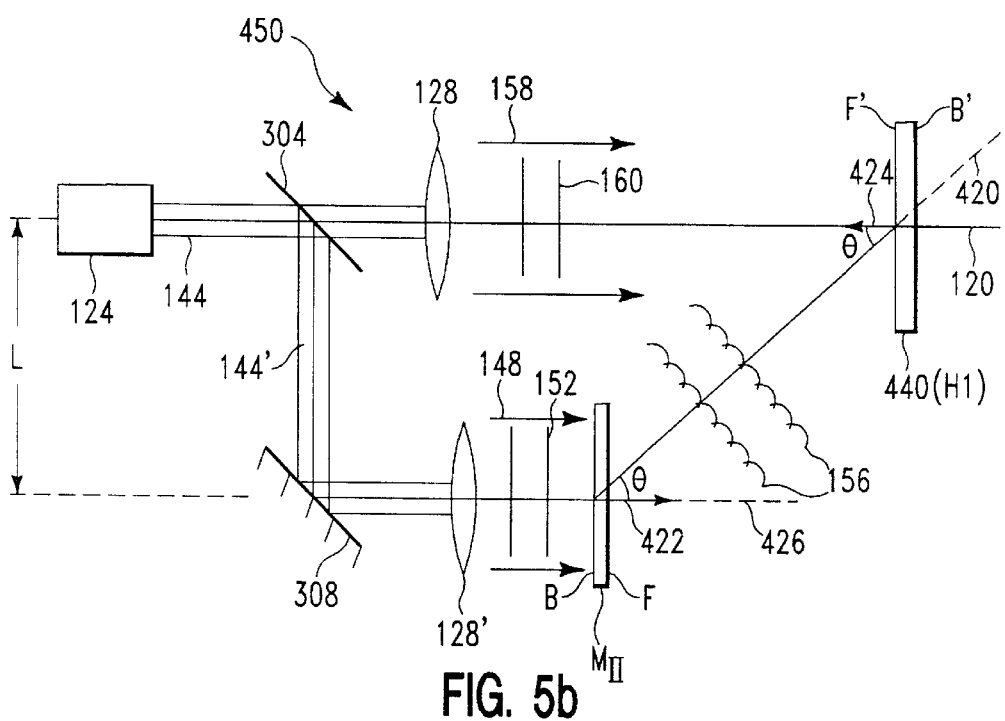
FIG. 5b is a schematic side view of a second apparatus for forming a hologram H1 of a type II object mask as part of a second two-step process for forming an ILHM of the present invention.
Figure 6:
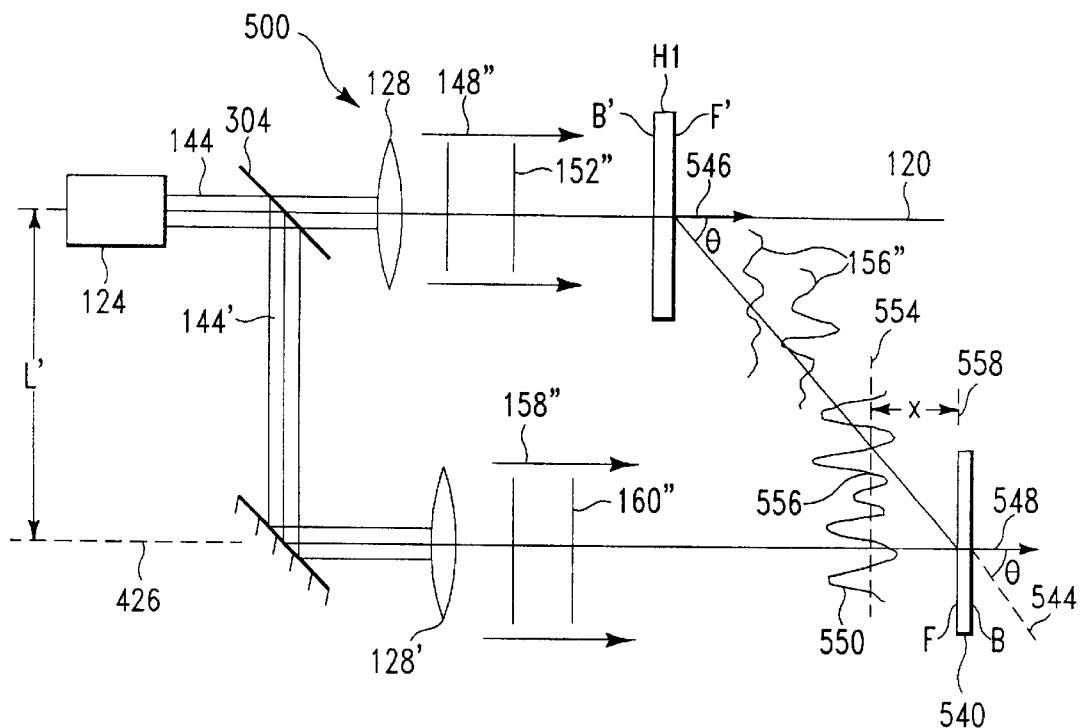
FIG. 6 is a schematic side view of an apparatus for forming an ILHM of the present invention from a hologram H1 formed using the apparatus of FIG. 5a or FIG. 5b.

FIGS. 5a, 5b and FIG. 6 are schematic side views of apparatus 400, 450 and 500 respectively, used for forming an ILHM 32 using a type II object mask and a two-step process, wherein the first step involves forming a first hologram H1, and the second step involves forming an ILHM 32 using first hologram H1.

With reference now to FIG. 5a, apparatus 400 includes all the elements of apparatus 100 of FIG. 2 and further includes a beamsplitter 304 disposed in coherent beam 144 to form a second coherent beam 144' to be used to form illumination beam 148. A mirror 308 redirects coherent beam 144' along an axis 420 oriented at an angle θ with respect to optical axis 120 and also directs the beam through expanding and collimating optics 128', thereby forming illumination beam 148. Meanwhile, coherent beam 144 is directed along axis 120 and passes through beam expanding and collimating optics 128 thereby forming a reference beam 158. A type II object mask MII is disposed in illumination beam 148 along axis 420 such that the angle between the object mask MII surface normal 422 and axis 420 is θ. A first recording medium 440 is disposed coaxial with and perpendicular to axis 120 in a plane parallel to object mask MII, at the location where axes 120 and 420 intersect. Recording medium 440 has a front surface F' and back surface B', and is disposed with front surface F' facing reference beam 158. Axis 420 passes through the centers of object mask MII and recording medium 440, and recording medium surface normal 424 and axis 420 form an angle θ. Also, an axis 426 parallel to axis 120 and separated therefrom by a distance L passes perpendicularly through the center of object mask MII.

When illumination beam 148 illuminates object mask MII, overlapping object wavefronts 156 are created, which propagate toward first recording medium 440 along axis 420. Hologram H1 is formed by recording, in recording medium 440, the interference pattern created by overlapping object wavefronts 156 and reference wavefronts 160.

With reference now to FIG. 5b, apparatus 450 is an alternate embodiment of apparatus 400 of FIG. 5a for forming hologram H1 as a first step in forming an ILHM 32 of the present invention using a two-step process. Apparatus 450 comprises the same elements as apparatus 400 in FIG. 5a, except that the elements are combined to form a different beam geometry than that of apparatus 400. In apparatus 450, illumination beam 148 is directed along an axis 426 and is normally incident object mask MII. Overlapping object wavefronts 156, created by illuminating object mask MII with illumination beam 148, are preferentially directed at an angle θ towards first recording medium 440 along axis 420 by the one or more mask elements (scattering, refracting or diffracting, not shown in the Figure and discussed in more detail below) on object mask MII or by a directional diffuser or grating (neither shown) on or near object mask MII. Hologram H1 is formed by recording, in recording medium 440, a substantially continuous diffracting region comprising the interference pattern created by the overlapping object wavefronts 156 and reference wavefronts 160 in reference beam 158.

With reference now to FIG. 6, the second step for forming ILHM 32 using first hologram H1 formed in the first step using either apparatus 400 or 450 is now described. Apparatus 500 has essentially the same geometry as that of apparatus 450 of FIG. 5b, and for the sake of simplicity, is shown to have the same elements as apparatus 450, except that object mask MII and first recording medium 440 are removed. In addition, the distance L' separating parallel axes 426 and 120 is greater than L. Hologram H1 now serves as the mask for forming an ILHM 32 using apparatus 500, and is disposed in illumination beam 148" with back surface B' facing illumination beam 148" (note that illumination beam 148" in apparatus 500 is the same as reference beam 158 in apparatus 450) and can also be considered to be a reconstruction beam. A second recording medium 540 with front surface F and back surface B is disposed in reference beam 158" along axis 426 in a plane substantially parallel to hologram H1 (note that reference beam 158" in apparatus 500 is the same as illumination beam 148 in apparatus 450). An axis 544 passing through the respective centers of hologram H1 and recording medium 540 forms an angle θ with respect to hologram H1 surface normal 546 and recording medium surface normal 548, as shown.

Hologram H1 is disposed such that when it is illuminated by illumination beam 148", diffracted wavefronts 156" form an in-focus real image 550 in an in-focus real image plane 554, which is parallel to face F of recording medium 540. The center 556 of in-focus real image 550 is located a distance L from axis 120. Second recording medium 540 is disposed in a defocused real image plane 558 a defocus distance x (e.g., 60 mm) away from in-focus real image plane 554 and in line with reference beam 158" along axis 426, so that a defocused real image (not shown) of in-focus real image 550 and reference wavefronts 160" are recorded in recording medium 540 as an ILHM 32. Because diffracted wavefronts 156" propagate along axis 544, recording a centered defocused real image in recording medium 540 at a distance x from best-focus real image plane 554 requires that axis 426 be separated from axis 120 by an distance, L'=L+xtan θ.

In a preferred embodiment of the present invention, an ILHM 32 is constructed by a two-step process using apparatus 400 of FIG. 5a and apparatus 500 of FIG. 6, comprising the steps of (1) with reference to apparatus 400 of FIG. 5a, (a) providing a first coherent reference beam 158 directed along axis 120; (b) providing a first coherent illumination beam 148 directed along axis 420 which forms an angle θ with axis 120; (c) providing a type II object mask MII disposed in first illumination beam 148 and along axis 420 such that the object mask MII surface normal 422 and axis 120 form an angle θ; (d) providing first recording medium 440 disposed along axis 120 adjacent object mask MII, and opposite source of coherent illumination 124, such that axis 420 passing through the respective centers of object mask MII and recording medium 440 form an angle θ with their respective surface normals 422 and 424; (e) illuminating object mask MII with first illumination beam 148 along axis 420, thereby creating object wavefronts 156 that propagate towards first recording medium 440 along axis 420; (f) simultaneous with step (1)(e), illuminating first recording medium 440 with first reference beam 158 along axis 120; (g) recording, in recording medium 440, a first hologram H1 having a substantially continuous diffracting region comprising the interference pattern created by overlapping object wavefronts 156 and reference wavefronts 160. Then, with reference to apparatus 500 of FIG. 6, (2)(a) providing a second coherent illumination beam 148", the same as or conjugate to first reference beam 158, directed along axis 120; (b) providing a second coherent reference beam 158" directed along axis 426, which is parallel to axis 120; (c) disposing hologram H1 in illumination beam 148" perpendicular to axis 120; (d) providing a second recording medium 540 disposed perpendicular to axis 426 in defocused real image plane 558, such that axis 544 passing through the respective centers of hologram H1 and recording medium 440 forms an angle θ with their respective surface normals 546 and 548; (e) illuminating hologram H1 with second illumination beam 148" along axis 420, thereby creating overlapping diffracted wavefronts 156" that propagate towards recording medium 540 along axis 544; (f) simultaneous with step (2)(e), illuminating recording medium 540 with reference beam 158"; and (g) recording, in recording medium 540, an ILHM 32 having a substantially continuous diffracting region comprising the interference pattern created by overlapping diffracted wavefronts 156" and reference wavefronts 160". The process for recording ILHM 32 recording medium 540 is described in more detail below.

Alternatively, with reference to apparatus 450 of FIG. 5b, in another preferred embodiment of the present invention, step (1) in the above two-step process for contracting ILHM 32 comprises the steps of: (a) providing a first coherent reference beam 158 directed along axis 120; (b) providing a first coherent illumination beam 148 directed along axis 426, which is parallel with axis 120; (c) providing a type II object mask MII disposed in first illumination beam 148 along axis 426; (d) providing first recording medium 440 perpendicular to axis 120 adjacent object mask MII and opposite source of coherent illumination 124, and disposed such that axis 420 passing through their respective centers form an angle θ with their respective surface normals 422 and 424; (e) illuminating object mask MII with first illumination beam 148 along axis 426, thereby creating overlapping object wavefronts 156 that propagate towards first recording medium 440 along axis 420 due to one or more directionally scattering, refracting, or diffracting elements on object mask MII or a directional diffuser or grating on or near object mask MII; (f) simultaneously with step (1)(e), illuminating first recording medium 440 with reference beam 158 along axis 120; and (g) recording, in recording medium 440, a first hologram H1 having a substantially continuous diffracting region comprising the interference pattern created by overlapping object wavefronts 156 and reference wavefronts 160. The process for recording ILHM 32 in recording medium 440 is described in more detail below.

Figure 7:
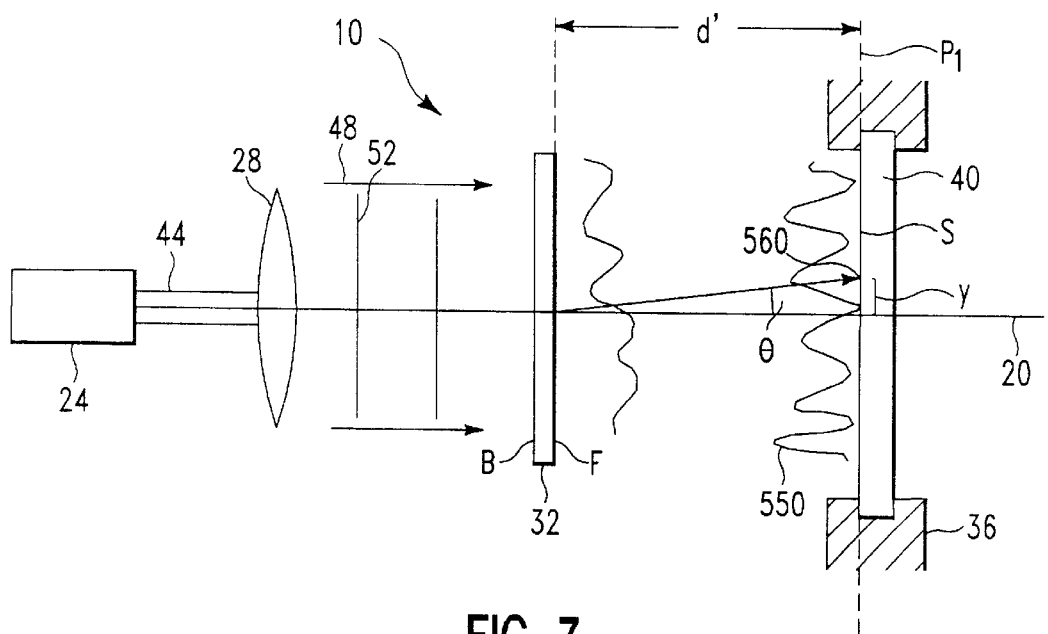
FIG. 7 is a schematic side view of the apparatus of FIG. 1 being used for patterning a workpiece with an ILHM formed using the apparatus of FIG. 6.

FIG. 7 is a schematic side view of the apparatus 10 of FIG. 1 being used for patterning a workpiece with ILHM 32 formed using either of the above-described two-step processes. Workpiece 40 is placed in workpiece holder 36 with its front surface S a distance d' away from front surface F of ILHM 32. In this arrangement, best-focus real image 550 is reproduced at surface S of workpiece 40, but the center 560 of best-focus real image 550 is displaced perpendicular to axis 20 by a distance y=d'tan θ. Thus, the workpiece can be patterned with best-focus real image 550 centered on front surface S of workpiece 40 by either displacing workpiece 40 by a distance y=d'tan θ with respect to ILHM 32, or by shifting ILHM 32 a distance −y=−d'tan θ with respect to workpiece 40.

Figure 8:
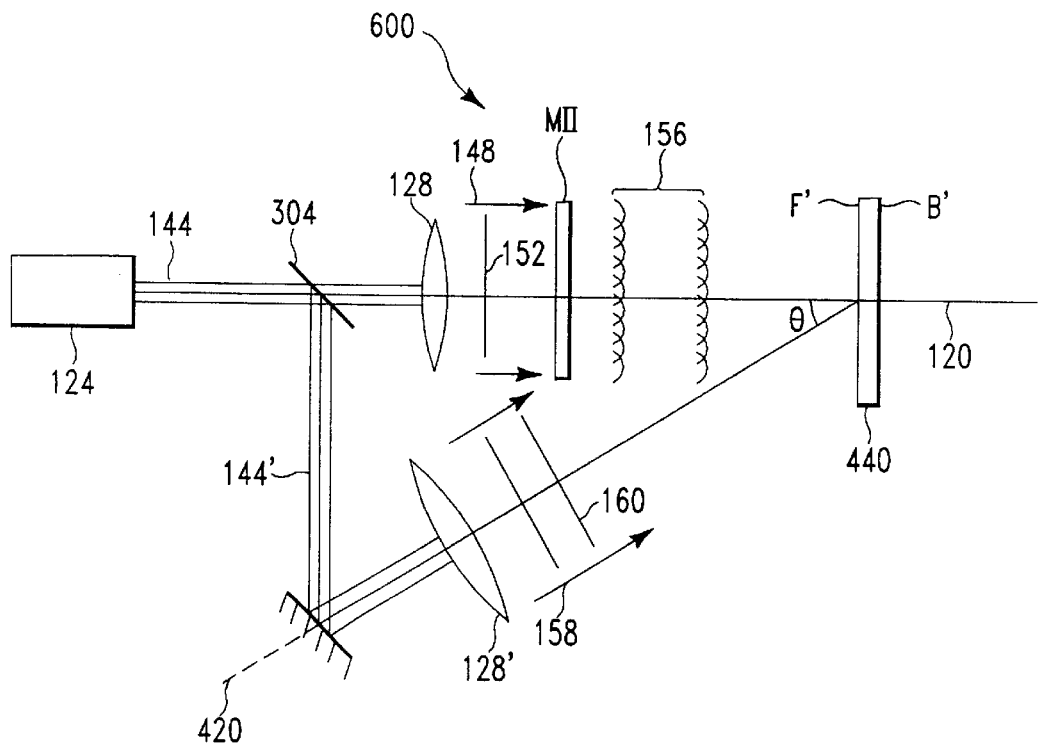
FIG. 8 is a schematic side view of an apparatus for forming a hologram H1 using a type II object mask as part of a third two-step process for forming an ILHM of the present invention.
Figure 9:
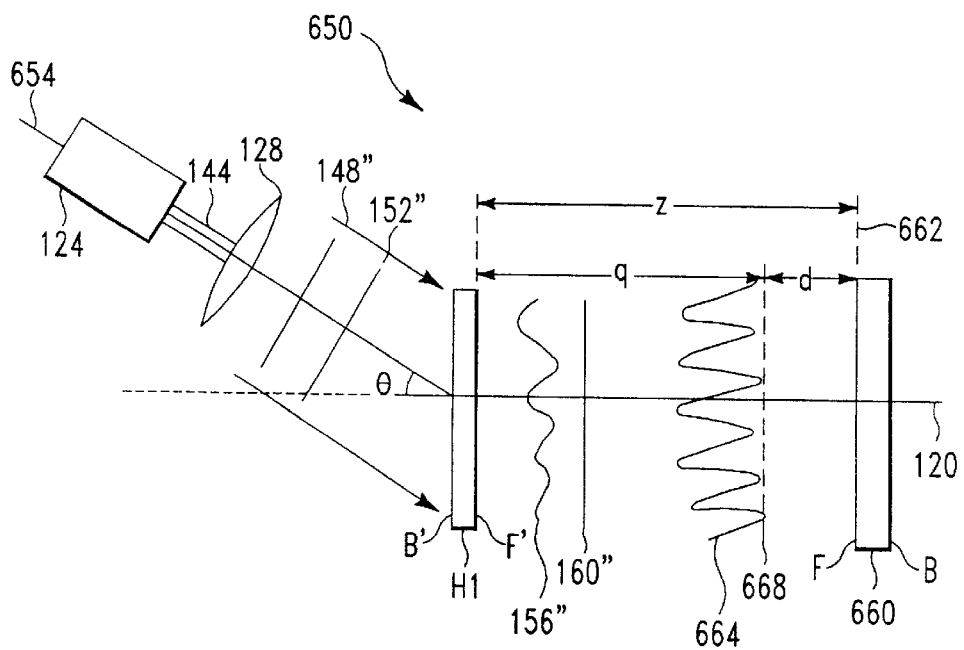
FIG. 9 is a schematic side view of an apparatus for forming an ILHM of the present invention from a hologram H1 formed using the apparatus of FIG. 8.

With reference now to FIGS. 8 and 9, there is shown schematic side views of a apparatus 600 and 650, respectively, for forming an ILHM 32 using a type II object mask and a third two-step process, wherein the first main step involves recording two interference patterns in a single hologram H1 using apparatus 600 of FIG. 8, and the second main step involves forming an ILHM 32 using hologram H1 as an object mask in apparatus 650 of FIG. 9.

Apparatus 600 of FIG. 8 is identical to apparatus 400 of FIG. 5a, except that object mask MII is disposed along axis 120 rather than axis 420, so that object wavefronts 156 are normally incident recording medium 440. In forming hologram H1 using apparatus 600 as part of the first main step, two sub-steps are required. The first sub-step is illuminating object mask MII with illumination beam 148, and simultaneously illuminating recording medium 440 with reference beam 158 directed along axis 420, thereby recording in recording medium 440 a first interference pattern from the interference of overlapping object wavefronts 156 and reference wavefronts 160. The second sub-step is removing object mask MII, and illuminating recording medium 440 with illumination beam 148 and reference beam 158, thereby recording in recording medium 440 a second interference pattern that overlaps the first interference pattern. When illumination beam 148 and reference beam 158 consist of plane waves, the second interference pattern is a grating. Thus, the hologram H1 formed in recording medium 440 actually contains two super-imposed holographic recordings: one of object mask MII and one of the interference pattern formed by illumination beam 148 and reference beam 158.

The second main step is creating the ILHM 32 using apparatus 650 of FIG. 9 and hologram H1 as formed in the first main step, as an object mask. Apparatus 600 includes source of coherent illumination 124 which provides illumination beam 148" directed along axis 654, which intersects axis 120 at an angle θ. Hologram H1 is disposed perpendicular to axis 120 where axis 654 intersects axis 120, and with its back surface B' facing illumination beam 148". A recording medium 660 having a front side F and a backside B is disposed along axis 120 adjacent hologram H1 and opposite illumination beam 148" in a defocused real image plane 662. Front surface F' of hologram H1 and front surface F of recording medium 660 are separated by a distance z. When hologram H1 is illuminated with illumination beam 148", two wavefronts are formed: diffracted wavefronts 156" arising from diffraction by the first superimposed recorded interference pattern, and reference wavefronts 160" arising from diffraction by the second superimposed recorded interference pattern. An in-focus real image 664 is formed at an in-focus real image plane 668 a distance q from front surface F' of hologram H1. Recording medium 660 is disposed with its front surface F parallel to in-focus image plane 668 at defocused real image plane 662, and a distance d=z−q away from in-focus real image plane 668, so that a defocused real image (not shown) and reference wavefronts 160" are recorded in recording medium 660 as an ILHM 32. It should be noted that recording medium 660 can also be placed in a defocused real image plane between hologram H1 and in-focus real image plane 668. The ILHM 32 is then used in apparatus 10 of FIG. 1 to pattern workpiece 40, as described above.

Figure 10:
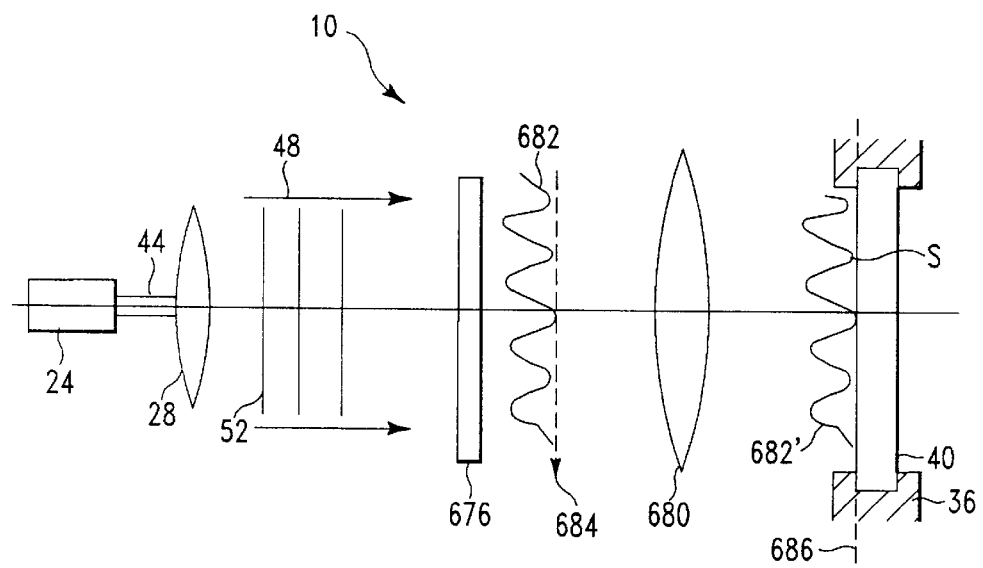
FIG. 10 is a schematic side view of an ILHM of the present invention as used in the apparatus in FIG. 1 in combination with a projection lens.

An important advantage of the ILHM 32 formed using the third two-step process as described above is that it can be readily used in combination with a projection lens. With reference to FIG. 10, there is shown such an ILHM 676 as used in apparatus 10 of FIG. 1 wherein apparatus 10 further includes a projection lens 680 placed between ILHM 676 and workpiece 40. Illuminating ILHM 676 with reconstruction beam 48 forms a real image 682 at object plane 684 of projection lens 680, which is then projected by projection lens 680 to form real image 682' on surfaces of workpiece 40 placed at the image plane of projection lens 680. Thus, it will be apparent that ILHM 676 (or, in fact, any of the ILHMs of the present invention) can be used in place of a standard mask used in existing photo patterning tools utilizing a projection lens.

Thus, with reference to apparatus 600 of FIG. 8 and apparatus 650 of FIG. 9, in a preferred embodiment of the present invention, an ILHM 32 is constructed as a two-step process. With reference to apparatus 600 of FIG. 8, the first step comprises (a) providing a first coherent illumination beam 148 directed along axis 120; (b) providing a type II object mask MII along axis 120; (c) providing a first recording medium 440 adjacent object mask MII and opposite source of coherent illumination 124; (d) illuminating object mask MII with illumination beam 148, thereby creating overlapping object wavefronts 156; (e) simultaneous with step (1)(d), illuminating first recording medium 440 with first reference beam 158 along an axis 420, which forms an angle θ with respect to axis 120; (f) recording in first recording medium 440, as hologram H1, a first interference pattern created by the interference between first overlapping object wavefronts 156 and reference wavefronts 160; (g) removing object mask MII and further recording in first recording medium 440, as hologram H1, a second interference pattern, superimposed on the first interference pattern, created by the interference between illumination beam 148 and reference beam 158.

Then, with respect to apparatus 650 of FIG. 9, the second step of the process involves (a) providing a second coherent illumination beam 148" conjugate to reference wavefronts 158 of step (1)(e), above, and directed along axis 654; (b) disposing hologram H1 in second illumination beam 148" along axis 120; (c) providing a second recording medium 660 coaxial with and adjacent first hologram H1 and opposite illumination beam 148" along axis 120, in defocused real image plane 662 a distance d on either side of in-focus real image plane 668 in which in-focus real image 664 from hologram H1 is formed; (d) illuminating first hologram H1 with second illumination beam 148" thereby forming (i) diffracted wavefronts 156" which form in-focus real image 664 at in-focus real image plane 668 as a result of the diffraction of second illumination beam 148" by the first recorded interference pattern in hologram H1, and (ii) diffracted reference wavefronts 160" coherent with diffracted wavefronts 156", formed by the diffraction of second illumination beam 148" by the second recorded interference pattern in first hologram H1; (e) recording, in second recording medium 660, an ILHM 32 having a substantially continuous diffracting region comprising the interference pattern from diffracted wavefronts 156" (which form a defocused real image at surface F of second recording medium 660), and diffracted reference wavefronts 160".

In forming hologram H1 in accordance with any of the three preferred two-step processes set forth above, a preferred recording step includes recording hologram H1 on a plate coated with silver halide, using an exposure between 200 to 600 ergs/cm$^2$, developing in Ilford developer for 3 minutes, bleaching in EDTA bleach until clear, and then drying the plate in a graded alcohol bath (50%, 75% and 100%). Hologram H1 can also be formed in UV materials like photopolymer or photoresist.

Recording the ILHM

In the preceding discussion, the process for recording an ILHM in the holographic recording medium is only mentioned in passing. Additional detail concerning how this recording is achieved is provided in this section.

To create a durable ILHM 32 according to the present invention, a recording medium such as photoresist is deposited on a quartz or fused silica substrate. After exposure, the recording medium is developed, and the substrate is etched using, for example, a reactive ion-etch (RIE) process or ion beam milling, in order to transfer the interference fringes recorded in the recording medium into the substrate. Adjustment of the etch parameters allows for the tailoring of the profile that is transferred into the substrate. The process of transferring the pattern recorded in the recording medium into a substrate that is durable, easily cleaned, and that has a low thermal expansion, high UV transparency, and high refractive index uniformity (e.g., optical quality quartz or fused silica) makes for an ILHM 32 that is eminently suitable for use in industrial applications because of its resistance to environmental affects, and high damage threshold to UV and DUV wavelengths.

A recording medium suitable for use in the present invention comprises, for example, Shipley 505 or 1805 photoresist spun onto a quartz or fused silica substrate to a thickness of about 10,000 Angstroms. The precise thickness of the layer can be varied to obtain a desired developed thickness prior to etching. The layer is then soft-baked at 95 degrees Centigrade for 30 minutes. In one example of this process, a recording medium is used to record an ILHM 32 of a mask having an array of substantially transparent phase-altering elements on a substantially transparent substrate (this type of mask is discussed in greater detail below). The ILHM 32 is formed by illuminating the mask with a coherent illumination beam having a wavelength of 413 nanometers (nm) and providing an exposure of about 20 to 50 millijoules/cm$^2$. The photoresist is then developed with Shipley MF319 maximum resolution developer, wherein the develop time was adjusted to yield the best resist profiles without "clipping" or "bottoming out" of the profiles. By adjusting the exposure time t, the intensity I of the beam, and the developing procedure, the exposure e=I×t can be adjusted such that the interference pattern is optimally recorded in the recording medium, which results in a high-efficiency ILHM 32.

Type I and Type II Object Masks of the Present Invention

The present invention uses four different specialized type I and type II object masks in forming an ILHM 32, called phase-altering, scattering, refracting and diffracting masks, in reference to the four different kinds of elements that make up each specialized mask. Each kind of element is substantially transparent and is designed to spread light transmitted through the element. It will be apparent to one skilled in the art that the degree to which the individual elements spread light passing therethrough can be tailored, and even made directional, by adjusting the relevant parameters pertaining to each type of element, as described below.

a. Phase Object Mask

Figure 11:
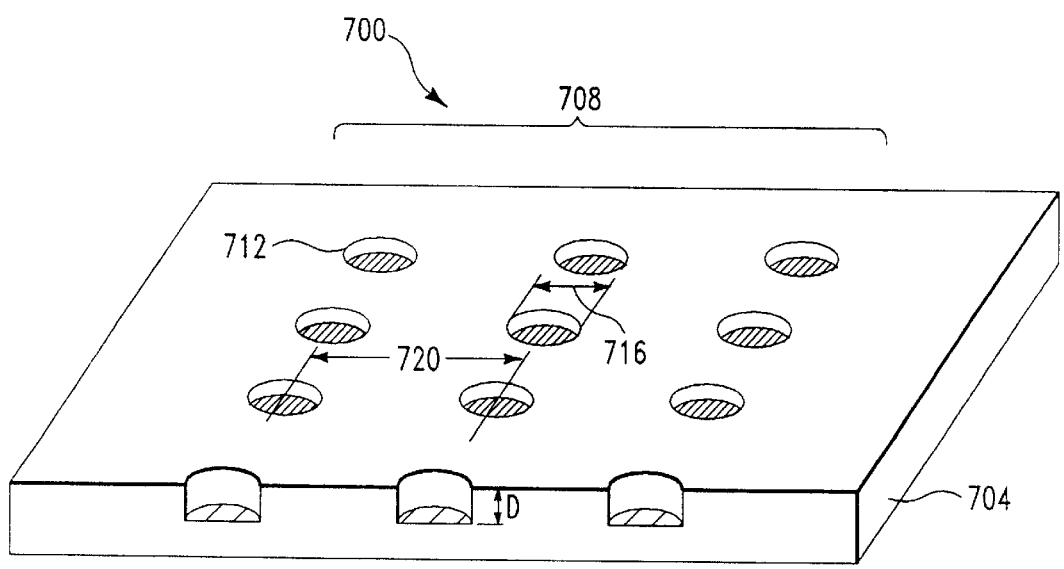
FIG. 11 is a perspective schematic view of a phase mask with an array of phase indentations as phase-altering elements.

FIG. 11 is a perspective schematic view of a phase mask 700 comprising a planar transparent substrate 704 having an array 708 of cylindrical-shaped indentations 712 of depth D, a diameter 716, and a center-to-center spacing 720. Indentations 712 are phase-altering elements that alter the phase of coherent light passing through mask 700. Indentations 712 are shown in FIG. 11 as being cylindrical for the sake of example. In practice, however, indentations 712 can be any desired shape. Indentations 712 may be formed in substrate 704 by any one of a number of techniques known in the art of mask-making, such as first coating the substrate with a layer of chrome, then providing a layer of photoresist on top of the chrome, then exposing the photoresist with a pattern consisting of an array of circular shapes (or any desired shape), then developing the photoresist, then etching the chrome, then ion milling or reactive ion etching or liquid etching the exposed substrate, and then removing the remaining chrome and photoresist. Removing the chrome from the substrate results in a type I phase mask. Alternatively, a sufficiently thin layer of chrome may be left on substrate 704 to reduce transmission of the mask to achieve a better beam ratio between the intensity of the transmitted reference wavefronts and the object wavefronts. A type II phase mask is formed by leaving a sufficiently thick layer of chrome on substrate 704 so that light does not pass through the regions of the substrate surrounding indentations 712.

With continuing reference to FIG. 11, the etch depth D into substrate 704 is adjusted according to the wavelength of illumination and amount of phase-shift required for the particular application. The relationship between the depth D of phase indentations 712 and the amount of phase shift $\Phi$ in radians at a wavelength $\lambda$ induced by phase indentations 712 is $D=\lambda\Phi/[(n-1)2\pi]$, where n is the index of refraction of substrate 704.

As an alternative to forming phase indentations, phase-shifting islands deposited on top of substrate 704 may be used. These island may be formed, for example, by sputtering quartz or another type of glass or UV transparent polymer onto substrate 704 using known lithographic techniques. In addition, other shapes besides circular phase indentations 712 may be used. The particular shape of the one or more phase objects is determined by the desired pattern to be formed in the workpiece, and whether that pattern can be created by one or more phase elements on the mask.

Figure 12:
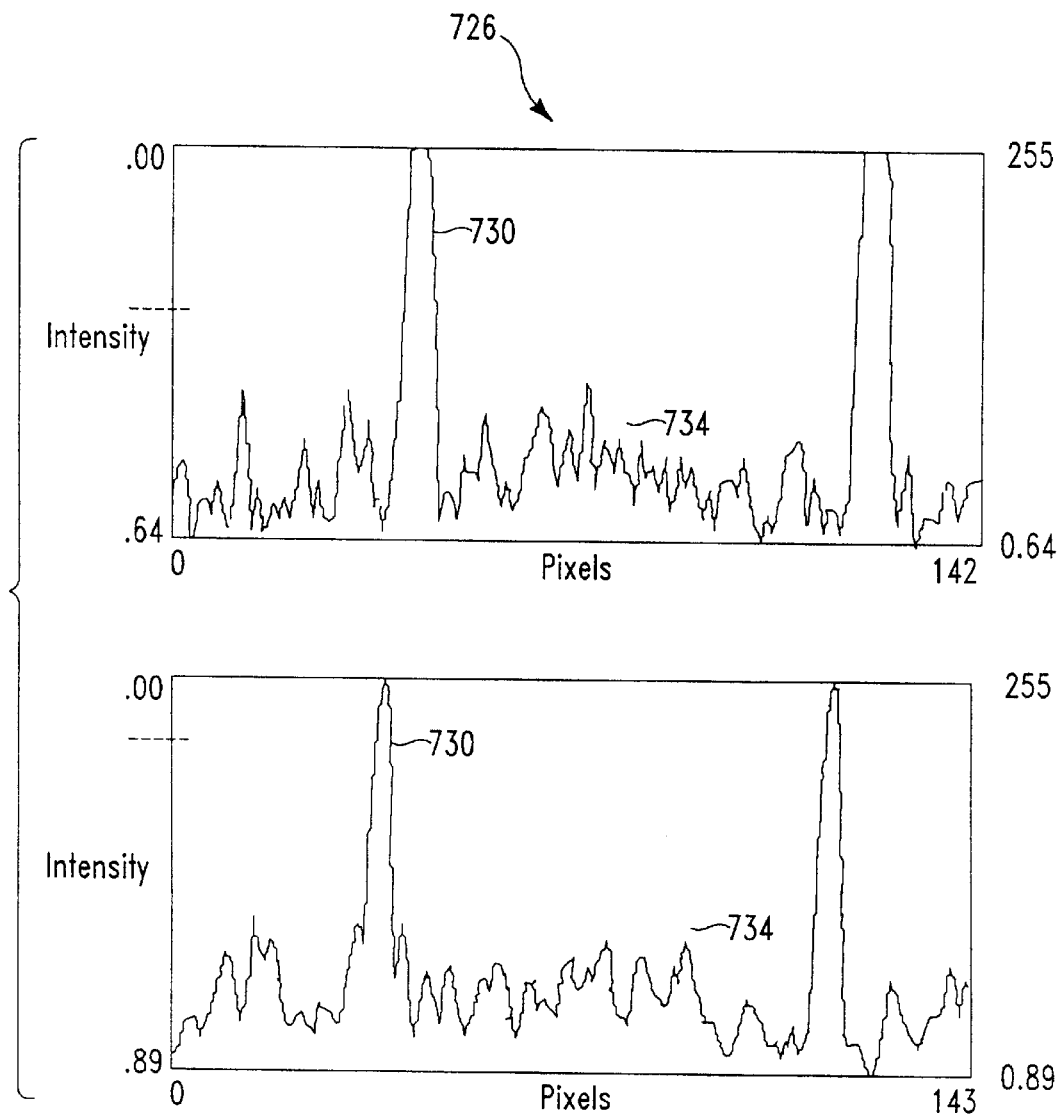
FIG. 12 is a plot of the spatial intensity distribution of a real image constructed from an ILHM formed using a type I phase object mask of FIG. 11.

FIG. 12 is a plot of the spatial intensity distribution 726 of a real holographic image reconstructed from an ILHM 32 fabricated using apparatus 100 of FIG. 2 and a type I phase object mask 700 of FIG. 11. Phase object mask 700 was an optical-quality quartz substrate 704 with cylindrical-shaped indentations 712 having a diameter 716 of 100 μm and a center-to-center spacing 720 of 1200 μm. As can be seen from the plot, the resultant spatial intensity distribution 726 has high-intensity peaks 730 well above the noise regions 734. This mask proved to be very well-suited for drilling holes in a plastic membranous workpiece.

b. Scattering Object Mask

Figure 13:
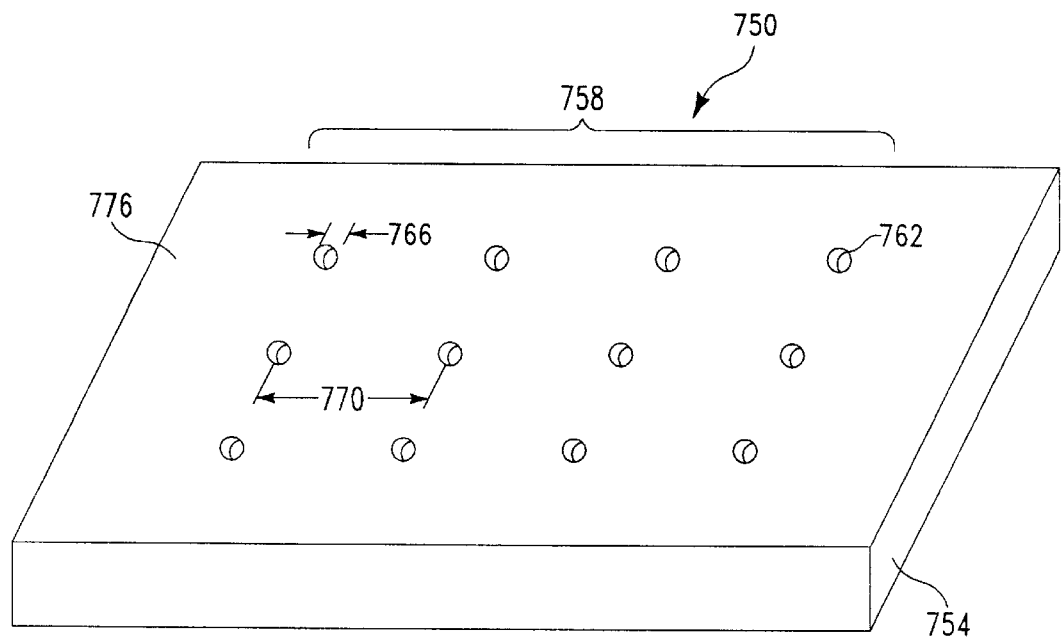
FIG. 13 is a perspective schematic view of a scattering mask with an array of scattering centers as scattering elements.

FIG. 13 is a perspective schematic view of a type I scattering object mask 750 comprising a planar transparent substrate 754 having an array 758 of small, circular scattering elements 762, each having a diameter 766 and separated by center-to-center spacing 770. Scattering elements 762 can be thought of as consisting of many very small randomly oriented facets or phase-shifting elements (not shown), which can be sufficiently small so that each scattering element 762 constitutes a diffuser. With reference to FIG. 2, when scattering object mask 750 is placed in apparatus 100 and illuminated by illumination beam 148, the individual scattering elements 762 each distributes a small portion of illumination beam 148 over recording medium 140 as a set of small, randomly directed plane waves. The collection of these sets of plane waves from each scattering element 762 constitutes overlapping object wavefronts 156. When overlapping object wavefronts 156 are combined with reference wavefronts 160 and recorded in recording medium 140, the result is an ILHM 32 having a substantially continuous diffracting region comprising an interference pattern with a large interference term. When an ILHM 32 thus formed is replayed in apparatus 10 of FIG. 1, the light from reconstruction beam 48 is recombined at the surface S of workpiece 40 (i.e., at plane P1) as small circular images capable of patterning workpiece 40.

With continuing reference to FIG. 13, scattering elements 762 are formed on scattering object mask 750 by any one of a number of techniques known in the art of mask-making, such as first covering the substrate 754 with a chrome layer, then depositing a layer of photoresist on top of the chrome layer, then exposing the desired pattern into the photoresist, then developing the photoresist, then etching the chrome, then removing the photoresist, and then liquid etching the exposed substrate using a dilute mixture of ammonium bifluoride and barium sulfate, to produce frosted scattering elements having a desired scattering distribution (e.g., lambertian). This results in a type II scattering object mask wherein the area 776 of substrate 754 surrounding scattering elements 762 is covered with an opaque chrome layer. A type I scattering object mask is formed by the additional step of removing the chrome layer so that area 776 is transparent or semi-transparent. The etchant dilution, temperature, time of the etching, and the material of substrate 754 determines the amount of surface roughness and hence the scattering profile of scattering elements 762. A preferred amount of surface roughness is between 0.3 $\mu$m and 3 $\mu$m. Scattering elements 762 can also be made to scatter or diffuse light in a preferred direction by introducing a wedge into each element, or imparting a preferred etch or facet direction to each element.

c. Refracting Object Mask

Figure 14:
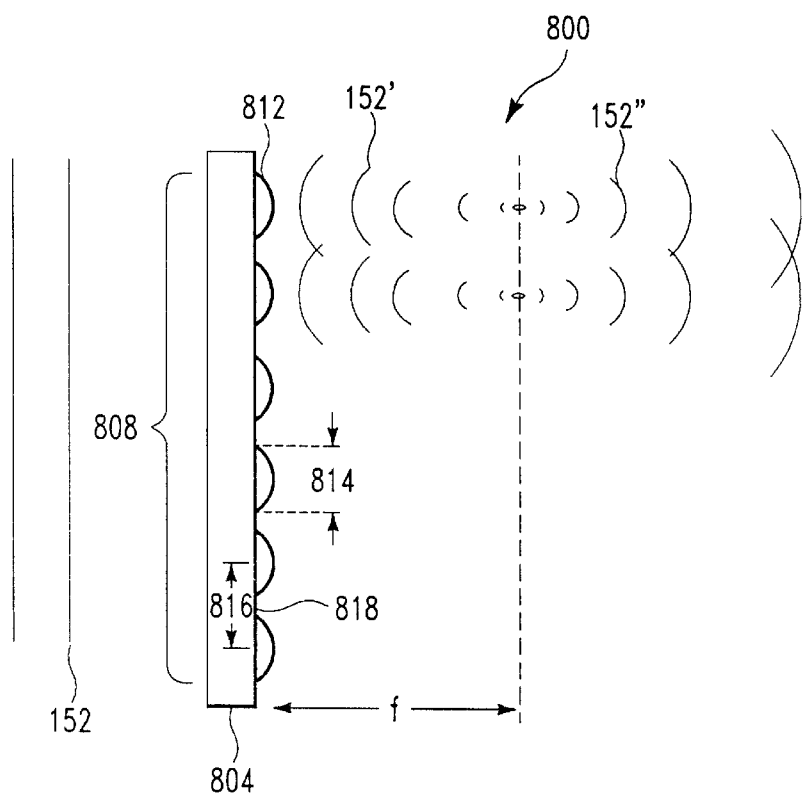
FIG. 14 is a schematic side view of a diffracting object mask having an array of lenslet elements, and illustrates how the lenslets produce converging and diverging wavefronts from incident plane wavefronts.

FIG. 14 is a schematic side-view of a refracting object mask 800 comprising a planar transparent substrate 804 having an array 808 of lenslets 812. Lenslets 812 are shown as positive plano-convex lens elements having a focal length f, a diameter 814, and a center-to-center spacing 816. Lenslets 812 convert plane illumination wavefronts 152 into converging spherical wavefronts 152', which after a distance f from refracting object mask 800 become diverging and spherical wavefronts 152". Diverging and spherical wavefronts 152" are akin to those formed from diffraction by a very small aperture. Diverging and spherical wavefronts 152" from adjacent lenslets 812 in lenslet array 808 can be made to overlap more or less strongly by choosing the appropriate lenslet diameter 814, center-to-center spacing 816, and focal length f. Recording an ILHM 32 of wavefronts 152" generated by diffraction with small apertures is difficult because the amount of light transmitted is often too small to achieve the proper intensity balance between the object wavefronts and the reference wavefronts. However, refracting mask 800 transmits sufficient light through lenslets 812 to allow for a holographic recording. The result is an ILHM 32 with a substantially continuous diffracting region comprising an interference pattern with a large interference term. Thus, in forming the ILHM 32 of the present invention using refracting object mask 800, the distance d in FIG. 2 should satisfy the condition d>f (see in FIG. 14) so that diverging spherical wavefronts 152" overlap at recording medium 140. Then, in patterning a workpiece using apparatus 10 of FIG. 1 with an ILHM 32 thus formed, the distance d' will be given by the relation d'=d−f.

With continuing reference to FIG. 14, in a type I refracting object mask, the regions 818 between lenslets 812 are transparent or semi-transparent. In a type II refracting object mask, regions 818 are sufficiently opaque to prevent any transmitted light from being recorded in the ILHM 32. When an ILHM 32 is formed using a type I or type II refracting object mask according to the present invention and is replayed in apparatus 10 of FIG. 1, an array of sharp points of light are formed at plane P1.

A first method of forming a type I refracting object mask is first providing a substrate such as quartz, then depositing a layer of positive photoresist on its upper surface, then exposing a pattern consisting of an array of circles in the photoresist, then developing the photoresist to create holes in the photoresist, then isotopically etching the quartz until the holes take on a concave shape.

A second method of forming a type I refracting object mask is first depositing a layer of negative photoresist on a substrate, then exposing the photoresist with UV illumination through a mask having an array of circular apertures, then developing the photoresist layer thereby creating an array of cylindrical photoresist islands, then heating the photoresist islands so that they melt and spread to form the lenslet elements 812, as shown in FIG. 14. For example, Shipley S 1827 photoresist, which has a melting temperature of 135° C., can be used to form plano-convex lenslets with a diameter of 25 $\mu$m, a thickness of 2.2 $\mu$m, and an index of refraction of about 1.6.

A method of forming a type II refracting object mask or a semi-transparent type I refracting object mask is first providing a transparent substrate, such as quartz then coating the upper surface of the substrate with a layer of semi-transparent or opaque chrome, then depositing a layer of positive photoresist on top of the chrome layer, then exposing the desired patterns in the photoresist, then developing the photoresist, then etching the chrome layer to create apertures in the chrome layer, then depositing another layer of negative photoresist exposing from the back and then developing so that the resist now fills the chrome spaces, then melting the photoresist layer until the photoresist island takes on a convex shape.

Negative plano-concave lenslets 812 may also be formed by creating hemispherical indentations in substrate 804. A first method of forming a type I or type II refracting object mask having negative plano-concave lenslets includes the steps of coating substrate 804 with a thick layer of photoresist, then exposing the photoresist with a mask having an array of shaped apertures or features with a specified optical density gradient, developing the photoresist thereby creating an array of shaped indentations in the photoresist.

A second method of forming the same mask includes the steps of coating substrate 804 with a suitably soft transparent material, such as acrylic polymer, and then impressing hemispherical indentations into the photoresist by contacting it with a template.

For plano-concave lenslets, the focal length f of each lenslets is negative, which results in the creation of diverging wavefronts, so the distance d can be any value (see FIG. 14).

d. Diffracting Object Mask

Figure 15:
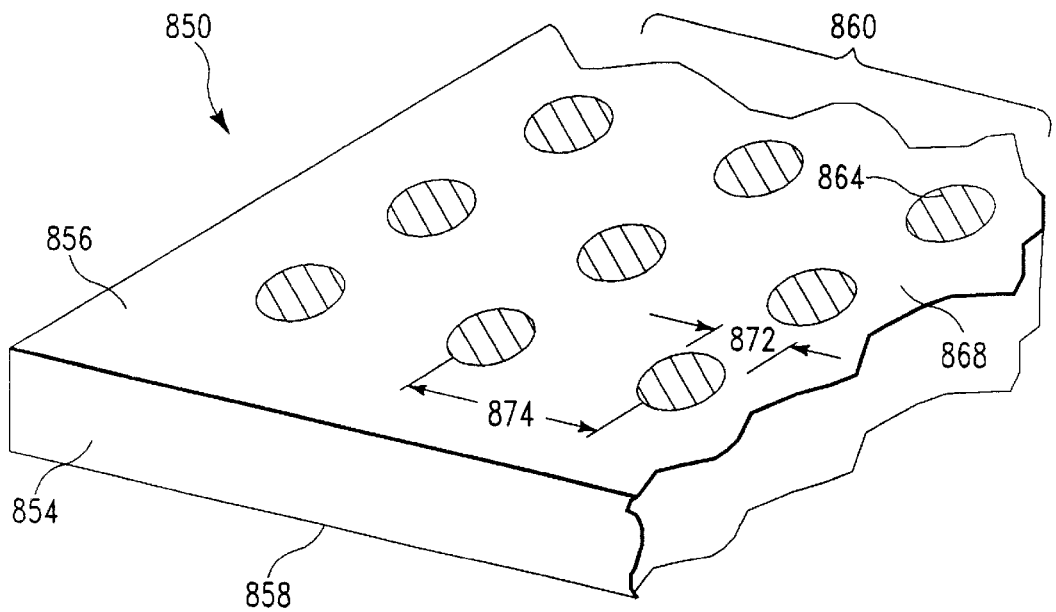
FIG. 15 is a partial perspective schematic view of a diffracting object mask with an array of grating elements.

FIG. 15 shows a section of a diffracting object mask 850 comprising a planar transparent substrate 854 with a front surface 856 and a back surface 858. On front surface 856 there is an array 860 of grating elements 864 each surrounded by a region 868. In a type I diffracting object mask, region 868 is transparent or semi-transparent. In a type II phase mask, region 868 is opaque. Grating elements 864 are shown in the Figure as circular in shape with a diameter 872 and a center-to-center spacing 874, with a periodic linear grating enclosed therein. Generally, grating elements 864 can have any shape (e.g., square, rectangular, triangular, polygonal, crossed, etc.) and, more generally, can be any diffracting structure for redirecting, diverging, or converging light passing therethrough, such as a hologram.

Figure 16:
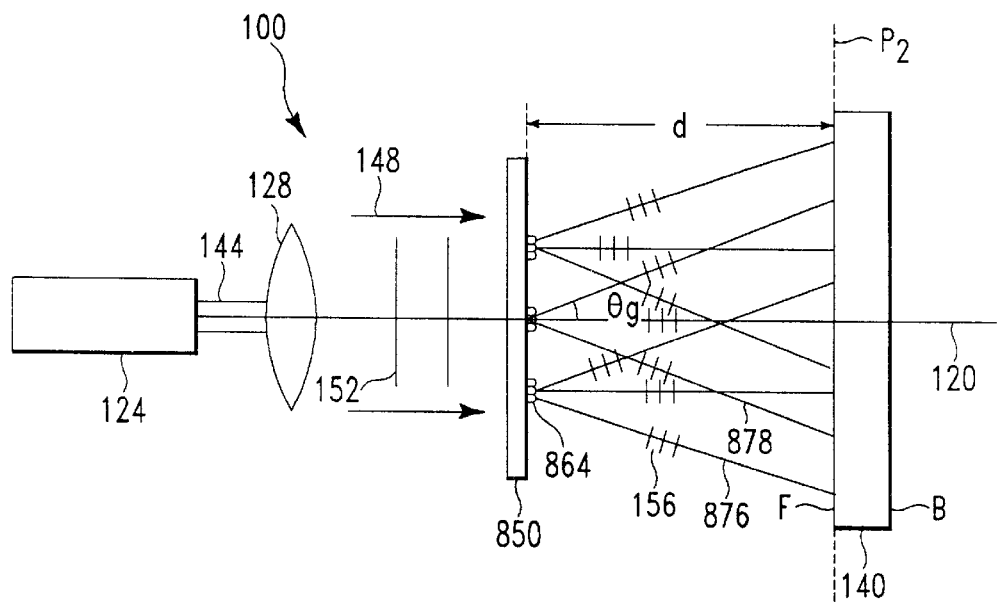
FIG. 16 is a schematic side view of the apparatus of FIG. 1 with a type I diffracting object mask of FIG. 15 being used to form an ILHM of the present invention.

Referring now to FIG. 16, there is shown apparatus 100 of FIG. 1 with type I diffracting object mask 850 of FIG. 15 being used to form an ILHM 32 according to the present invention. When diffracting object mask 850 is illuminated with illumination beam 148, each grating element 864 creates a set of wavefronts 156 that propagate in a plurality of well-defined directions determined by the precise nature of each grating element 864. In the Figure, only the zeroeth-order wavefronts 876 and first-order wavefronts 878 with angle $\theta_g$ are shown. Zeroeth-order wavefronts 876 are undiffracted but attenuated illumination wavefronts 152 that serve as reference wavefronts in forming the ILHM 32. The proper choice of grating frequency ν of grating elements 864 and distance d will result in overlapping object wavefronts 156 from each grating structure 864 at recording medium 140, resulting in an ILHM 32 having a substantially continuous diffracting region with a large interference term. For a diffraction grating, the diffraction angle $\theta_g$ is determined from the relation $\sin\theta_g = \lambda \nu$.

An ILHM 32 formed using a type I or type II diffracting object mask 850 of FIG. 15 with, for example, a crossed grating and a circular outer shape produces an array of circular images, each containing an array of bright spots within. This type of image is useful for ablating areas on a workpiece, since the bright spots represent a high-concentration of energy. As an example, a type II diffracting object mask is fabricated wherein grating elements 864 are each a uniform grating having a period of 50 cycles/mm, a diameter 872 of 100 μm, and a center-to-center spacing 874 of 1200 μm. The ILHM 32 formed from this mask using apparatus 100 of FIG. 2 is then used to pattern a workpiece.

With reference now to FIGS. 17a–e there is shown the steps of a preferred method for creating a type I or type II diffracting object mask. With reference to FIG. 17a, the method includes the steps of providing substrate 854 and coating front surface 856 with an opaque layer 890 (such as dark chrome), then forming apertures 892 of an arbitrary shape in opaque layer 890 so as to expose underlying substrate 854 using standard techniques known in the art (e.g., coating with photoresist, exposing the photoresist, developing the photoresist and then etching the opaque layer).

Referring now to FIG. 17b, the next step is coating opaque layer 890 with a negative photoresist layer 894 such as AZ OMR 83.

Referring to FIG. 17c, the next step is exposing photoresist layer 894 through back surface 858 with two interfering plane wave beams 896 and 898 propagating at angles β and γ with respect to an axis 900, which passes perpendicular through the center of substrate 854. Plane wave beams 896 and 898 are generated by the standard techniques, such as the one shown in the Figure, which includes providing a light beam 44 emanating from coherent source of illumination 24 and dividing the beam with a beamsplitter 304, thereby forming two coherent beams 44 and 44', which are directed by beamsplitter 304 and mirror 308, respectively, to beam expanding and collimating optics 28 and 28' located in beams 44 and 44', respectively. Plane wave beams 896 and 898 are then made to interfere within photoresist layer 894 at an angle $\phi = \beta + \gamma$.

With reference now to FIG. 17d, grating element 864 with grating lines 904 is formed in photoresist layer 894 within each aperture 892. The spacing ε between adjacent grating lines 904 is given by $\epsilon = \lambda/\sin\phi$, where λ is the illumination wavelength from coherent source of illumination 24. At this point in the fabrication process, opaque layer 890 can be left in place to create a type II diffracting object mask as shown in FIG. 17d. Alternatively, opaque layer 890 can be stripped to form a type I diffracting object mask, as shown in FIG. 17e, comprising groupings of grating lines 904 on surface 856 of substrate 854.

An alternate embodiment of diffracting object mask 850 is shown in FIG. 18. Type II grating mask 950, shown in side-view, has the same elements as those shown in FIG. 17a, and further includes a grating 954 on backside 858. Grating 954 is formed by following essentially the aforementioned steps 17a–e in forming grating mask 850, except that negative photoresist layer 894 is deposited on backside 858 rather than on opaque layer 890 (see FIG. 176), plane wave beams 896 and 898 (see FIG. 17c) are made to interfere in the negative photoresist layer deposited on backside 858, and that opaque layer 890 is left in place on substrate 854. Thus, diffracting object mask 950 functions essentially in the same way as diffracting object mask 850, except that the grating structure 954 in diffracting object mask 950 is continuous and displaced from apertures 892 by the thickness of substrate 854.

Exemplary Process of Forming an ILHM

Now described is an example of a process for forming an ILHM 32 with a semi-transparent phase object mask, where the ILHM 32 could be used, for instance, to perform excimer laser ablation of 2 mil (0.0002" thick) polyimide film (such as DuPont's Kapton™). This ablation procedure is presently routinely performed using more complex and expensive phototools in the production of flexible circuits of the type used in microelectronics packaging for semiconductor chips used in consumer devices such as cellular telephones and portable computers. The ILHM 32 formed using the present specific process example can also be utilized in the production of inkjet printer nozzles, liquid crystal displays, alphanumeric markings on metals, ball grid array packages in ceramic or plastic. Also, with lower power (i.e., non-ablative) illumination, the ILHM 32 of the present specific process example could be used to expose photoresist or other photoactive materials placed on silicon or other substrates. Many other uses will be apparent to one skilled in the art, including the patterning of three dimensional structures with high aspect ratios.

The first main step in forming the ILHM 32 of the present specific process example is preparing the phase object mask. In the preferred process, the density of the chrome on the mask should be such that the beam ratio between the undiffracted illumination beam (i.e., the reference beam) and the object beam (i.e., diffracted object wavefronts) caused by the phase-shifting and diffraction of the incident illumination beam by the etched phase structures is approximately 3:1. Continuing with a description of the preferred process, a quartz substrate is then coated with chrome to an optical density of 0.6, and a layer of Shipley 1800 series photoresist is deposited atop the chrome layer. The photoresist is then exposed with UV light in a contact copy jib (such as that manufactured by Oriel Corporation) using an electron beam patterned master mask with a dark field and clear features. The photoresist is then developed in Shipley MF312 developer diluted 1:1 with DI water. The chrome is then etched in Transene type 1020 chromium mask etchant. The quartz in the resulting open areas is then etched using a 10% concentration of buffered hydrofluoric acid to a depth equivalent to a 180 degree phase shift in the wavelength used for the exposure. For 413 nm light this depth is approximately 210 nm. Reactive ion etching can also been used for this step where less undercut of the chrome layer is desired.

The second main step is to place the phase mask in a collimated beam of light (e.g., a Lambda-Physik EMG 104 excimer laser emitting at 248 mn) and holographically exposing an excimer grade fused silica plate (Corning 7940 or Heraeus Supersil) coated with Shipley SPR511A photoresist, disposed a distance of 5 cm away from the phase object mask. The photoresist is then developed in Shipley MF319 developer and the quartz substrate reactive ion etched to an average depth of approximately 250 nm with Freon 14 and oxygen (approx 8%) using the photoresist as a mask.

Alternatives and variations to any of the above-mentioned specific method can be employed to make a ILHM 32 that will result in the same functionality and thus still be within the spirit and scope of the present invention. In fact, while the present invention has been described in connection with preferred embodiments, it will be understood that it is not limited to those embodiments. On the contrary, it is intended to cover all alternatives, modifications, and equivalents as may be included within the spirit and scope of the invention as described herein.

What is claimed is:

1. A method of imparting an image to a workpiece comprising the steps of:
    a) forming an in-line holographic mask by;
        a1) providing an object mask, a recording medium, and a first source of illumination, said object mask having a first side, said recording medium having a first face;
        a2) providing illumination from said first source of illumination to said first side to generate object waves incident on said first face;
        a3) using illumination from said first source of illumination to generate reference waves incident on said first face so as to interfere with said object waves incident on said first face, wherein said object mask does not shadow said central region of said recording medium from reference waves;
        a4) recording an interference pattern of said interfering waves in said recording medium;
    b) providing a second source of illumination for generating a reconstruction beam, said reconstruction beam having a reconstruction beam wavelength and reconstruction beam fluence;
    c) providing a workpiece; and
    d) illuminating said recording of said interference pattern with said reconstruction beam so as to impart a real image to the workpiece, wherein said reconstruction beam has a wavelength different from the wavelength of said illumination in said step (a2) and (a3).

2. A method of imparting an image in a workpiece according to claim 1, wherein said reconstruction beam wavelength is between IR and DUV.

3. A method of imparting an image in a workpiece according to claim 1, wherein said illumination from said first source of illumination consists of a single wavelength.

4. A method of imparting an image in a workpiece according to claim 1, wherein said illumination from said first source of illumination is substantially coherent.

5. A method of imparting an image in a workpiece according to claim 1, wherein in said illuminating step (d) said image is axially displaced depending on said reconstruction wavelength.

6. A method of imparting an image in a workpiece according to claim 1, wherein said recording of said interference pattern includes a central area of said recording medium, and said central area contributes to said real image.

7. An apparatus for patterning a workpiece comprising:
    a source of illumination, an in-line holographic mask, and a workpiece holder, wherein:
        said source of illumination provides illumination having an associated wavelength, said illumination for generating a reconstruction beam extending along an axis;
        said in-line holographic mask comprises a recording of wave interference from an object mask, wherein a portion of said recording is disposed on said axis between said source of illumination and said workpiece holder; and
        said workpiece holder is disposed for holding a portion of the workpiece on said axis wherein a portion of said reconstruction beam extending along said axis and illuminating said portion of said recording on said axis can form a real image on the workpiece.

8. An apparatus for patterning a workpiece according to claim 7, wherein said in-line holographic mask is made optically at a construction wavelength different from said source of illumination associated wavelength.

9. An apparatus for patterning a workpiece according to claim 8, wherein said in-line holographic mask is a transparent relief hologram formed in a substrate capable of transmitting electromagnetic energy having a wavelength in the range from IR to x-ray.

10. An apparatus for patterning a workpiece according to claim 7, wherein said reconstruction beam has a wavelength between IR to x-ray.

11. A method of imparting an image to a workpiece comprising the steps of:
    a) forming an in-line holographic mask by:
        a1) providing an object mask, a recording medium, and a first source of illumination, said object mask having a first side, said recording medium having a first face, said recording medium further comprising a central region;
        a2) providing illumination from said first source of illumination to said first side to generate object waves incident on said first face;
        a3) using illumination from said first source of illumination to generate reference waves incident on said first face so as to interfere with said object waves incident on said first face, wherein said object mask does not shadow said central region of said recording medium from reference waves;
        a4) recording an interference pattern of said interfering waves in at least said central region of said recording medium;
    b) providing a second source of illumination for generating a reconstruction beam, said reconstruction beam having a reconstruction beam wavelength and reconstruction beam fluence;

c) providing a workpiece; and d) illuminating said recording of said interference pattern with said reconstruction beam so as to impart a plurality of independent real images to the workpiece.

12. A method of imparting an image in a workpiece according to claim 11, wherein said holographic recording comprises multiple holograms and wherein said independent real images corresponding to said multiple holograms.

13. A method of imparting an image in a workpiece according to claim 11, wherein said independent real images are spatially displaced from one another.

14. A method of imparting an image to a workpiece comprising the steps of:

a) forming an in-line holographic mask by:

a1) providing an object mask, a recording medium, and a first source of illumination, said object mask having a first side, said recording medium having a first face, said recording medium further comprising a central region;

a2) providing illumination from said first source of illumination to said first side to generate object waves incident on said first face;

a3) using illumination from said first source of illumination to generate reference waves incident on said first face so as to interfere with said object waves incident on said first face, wherein said object mask does not shadow said central region of said recording medium from reference waves;

a4) recording an interference pattern of said interfering waves in at least said central region of said recording medium;

b) providing a second source of illumination for generating a reconstruction beam, said reconstruction beam having a reconstruction beam wavelength and reconstruction beam fluence;

c) providing a workpiece; and d) illuminating said recording of said interference pattern with said reconstruction beam so as to impart a real image to the workpiece, wherein said real image is directed to a material, wherein said real image is for simultaneously drilling multiple holes in the material.

15. A method of imparting an image to a workpiece comprising the steps of:

a) forming an in-line holographic mask by:

a1) providing an object mask, a recording medium, and a first source of illumination, said object mask having a first side, said recording medium having a first face, said recording medium further comprising a central region;

a2) providing illumination from said first source of illumination to said first side to generate object waves incident on said first face;

a3) using illumination from said first source of illumination to generate reference waves incident on said first face so as to interfere with said object waves incident on said first face, wherein said object mask does not shadow said central region of said recording medium from reference waves;

a4) recording an interference pattern of said interfering waves in at least said central region of said recording medium;

b) providing a second source of illumination for generating a reconstruction beam, said reconstruction beam having a reconstruction beam wavelength and reconstruction beam fluence;

c) providing a workpiece; and d) illuminating said recording of said interference pattern with said reconstruction beam so as to impart a real image to the workpiece, wherein said real image is directed to a material, wherein said real image is for ablating the material in a pattern corresponding to said real image.

16. A method of imparting an image in a workpiece according to claim 15, wherein the workpiece is coated with a layer of material sensitive to said reconstruction beam wavelength.

17. A method of imparting an image in a workpiece according to claim 16, wherein said layer of material is a polymer.

18. A method of imparting an image in a workpiece according to claim 16, wherein said layer of material is photoresist.

19. A method of imparting an image to a workpiece comprising the steps of:

a) forming an in-line holographic mask by:

a1) providing an object mask, a recording medium, and a first source of illumination, said object mask having a first side, said recording medium having a first face, said recording medium further comprising a central region;

a2) providing illumination from said first source of illumination to said first side to generate object waves incident on said first face;

a3) using illumination from said first source of illumination to generate reference waves incident on said first face so as to interfere with said object waves incident on said first face, wherein said object mask does not shadow said central region of said recording medium from reference waves;

a4) recording an interference pattern of said interfering waves in at least said central region of said recording medium;

b) providing a second source of illumination for generating a reconstruction beam, said reconstruction beam having a reconstruction beam wavelength and reconstruction beam fluence;

c) providing a workpiece; and d) illuminating said recording of said interference pattern with said reconstruction beam so as to impart a real image to the workpiece, further comprising providing a lens for focusing said real image.

20. A method of imparting an image to a workpiece comprising the steps of:

a) forming an in-line holographic mask by:

a1) providing an object mask, a recording medium, and a first source of illumination, said object mask having a first side, said recording medium having a first face, said recording medium further comprising a central region;

a2) providing illumination from said first source of illumination to said first side to generate object waves incident on said first face;

a3) using illumination from said first source of illumination to generate reference waves incident on said first face so as to interfere with said object waves incident on said first face, wherein said object mask does not shadow said central region of said recording medium from reference waves;

a4) recording an interference pattern of said interfering waves in at least said central region of said recording medium;

b) providing a second source of illumination for generating a reconstruction beam, said reconstruction beam having a reconstruction beam wavelength and reconstruction beam fluence;

c) providing a workpiece; and d) illuminating said recording of said interference pattern with said reconstruction beam so as to impart a real image to the workpiece, wherein said in-line holographic mask is made of a material that is substantially transparent and resistant to damage at said reconstruction beam wavelength and fluence, and wherein said in-line holographic mask is made using surface relief patterning of said material.

21. A method of imparting an image to a workpiece comprising the steps of:

a) forming an in-line holographic mask by:
  a1) providing an object mask, a recording medium, and a first source of illumination, said object mask having a first side, said recording medium having a first face, said recording medium further comprising a central region;
  a2) providing illumination from said first source of illumination to said first side to generate object waves incident on said first face;
  a3) using illumination from said first source of illumination to generate reference waves incident on said first face so as to interfere with said object waves incident on said first face, wherein said object mask does not shadow said central region of said recording medium from reference waves;
  a4) recording an interference pattern of said interfering waves in at least said central region of said recording medium;

b) providing a second source of illumination for generating a reconstruction beam, said reconstruction beam having a reconstruction beam wavelength and reconstruction beam fluence;

c) providing a workpiece; and d) illuminating said recording of said interference pattern with said reconstruction beam so as to impart a real image to the workpiece, wherein said recording comprises a surface relief pattern.

22. A method of imparting an image in a workpiece according to claim 21, wherein said recording medium comprises a material for ablation.

23. A method of imparting an image to a workpiece comprising the steps of:

a) forming an in-line holographic mask by:
  a1) providing an object mask, a recording medium, and a first source of illumination, said object mask having a first side, said recording medium having a first face, said recording medium further comprising a central region;
  a2) providing illumination from said first source of illumination to said first side to generate object waves incident on said first face;
  a3) using illumination from said first source of illumination to generate reference waves incident on said first face so as to interfere with said object waves incident on said first face, wherein said object mask does not shadow said central region of said recording medium from reference waves;
  a4) recording an interference pattern of said interfering waves in at least said central region of said recording medium;

b) providing a second source of illumination for generating a reconstruction beam, said reconstruction beam having a reconstruction beam wavelength and reconstruction beam fluence;

c) providing a workpiece; and d) illuminating said recording of said interference pattern with said reconstruction beam so as to impart a real image to the workpieces wherein the workpiece comprises a material for patterning with a three dimensional structure in a high aspect ratio.

24. A method of imparting an image to a workpiece comprising the steps of:

a) forming an in-line holographic mask by:
  a1) providing an object mask, a recording medium, and a first source of illumination, said object mask having a first side, said recording medium having a first face, said recording medium further comprising a central region;
  a2) providing illumination from said first source of illumination to said first side to generate object waves incident on said first face;
  a3) using illumination from said first source of illumination to generate reference waves incident on said first face so as to interfere with said object waves incident on said first face, wherein said object mask does not shadow said central region of said recording medium from reference waves;
  a4) recording an interference pattern of said interfering waves in at least said central region of said recording medium;

b) providing a second source of illumination for generating a reconstruction beam, said reconstruction beam having a reconstruction beam wavelength and reconstruction beam fluence;

c) providing a workpiece; and d) illuminating said recording of said interference pattern with said reconstruction beam so as to impart a real image to the workpiece, wherein said real image comprises a high intensity region and wherein said high intensity region is for photoablation or for fabricating microcircuits.

25. A method of imparting an image in a workpiece according to claim 24, wherein said real image is directed to a material.

26. A method of imparting an image in a workpiece according to claim 25, wherein said real image is for patterning the material by micromachining, heating, vaporizing, ablating, drilling, changing chemical bonds, or photolithographic patterning.

27. A method as recited in claim 25, wherein said high intensity region is for illuminating a light sensitive material.

28. A method as recited in claim 25, wherein said high intensity region is for exposing resist.

29. A method of imparting an image to a workpiece comprising the steps of:

a) forming an in-line holographic mask by:
  a1) providing an object mask, a recording medium, and a first source of illumination, said object mask having a first side, said recording medium having a first face, said recording medium further comprising a central region;
  a2) providing illumination from said first source of illumination to said first side to generate object waves incident on said first face;
  a3) using illumination from said first source of illumination to generate reference waves incident on said first face so as to interfere with said object waves incident on said first face, wherein said object mask does not shadow said central region of said recording medium from reference waves;

a4) recording an interference pattern of said interfering waves in at least said central region of said recording medium;

b) providing a second source of illumination for generating a reconstruction beam, said reconstruction beam having a reconstruction beam wavelength and reconstruction beam fluence;

c) providing a workpiece; and d) illuminating said recording of said interference pattern with said reconstruction beam so as to impart a real image to the workpiece, wherein said in-line holographic mask is made of a material that is substantially transparent and resistant to damage at said reconstruction beam wavelength and fluence, and wherein said in-line holographic mask is made using surface relief patterning of said material.

30. A method of imparting an image in a workpiece according to claim 29, wherein in said illuminating step (d) said reconstruction beam comprises a wavelength different from a wavelength of said illumination in said step (a2) and (a3).

31. A method of imparting an image in a workpiece according to claim 29, wherein said real image comprises a reconstruction of said recording that corresponds to said object mask.

32. A method of imparting an image in a workpiece according to claim 29, wherein said interference pattern is along a plane at normal incidence to said axis.

33. A method of imparting an image in a workpiece according to claim 32, wherein said recording is at normal incidence to said axis.

34. A method of imparting an image in a workpiece according to claim 29, wherein said recording comprises phase information or amplitude information.

35. A method of imparting an image in a workpiece according to claim 31, wherein said recording comprises both phase information and amplitude information.

36. A method of imparting an image in a workpiece according to claim 29, wherein said image falls on a layer of a photosensitive material.

37. A method of imparting an image in a workpiece according to claim 29, wherein said real image includes a geometric shape.

38. A method of imparting an image in a workpiece according to claim 37, wherein said geometric shape comprises a two dimensional or a three dimensional shape.

39. A method of imparting an image in a workpiece according to claim 29, wherein no image on said recording corresponds in shape to said real image.

40. A method of imparting an image in a workpiece according to claim 29, wherein said object mask includes a single object mask.

41. A method of imparting an image in a workpiece according to claim 40, wherein said image corresponds to a pattern on said object mask.

42. A method of imparting an image in a workpiece according to claim 29, wherein said recording medium comprises a photosensitive material.

43. A method of imparting an image in a workpiece according to claim 29, wherein said first source of illumination provides coherent or substantially coherent light.

44. A method of imparting an image in a workpiece according to claim 29, wherein said material comprises one from the group germanium, silicon, zinc selenide, zinc sulfide, quartz, BK7, diamond, Mylar, and beryllium.

45. A method of imparting an image in a workpiece according to claim 29, wherein said holographic mask is illuminated with said reconstruction beam at normal incidence.

46. A method of imparting an image in a workpiece according to claim 29, wherein light reflected off said object mask provides said object waves incident on said first face.

47. A method of imparting an image to a workpiece comprising the steps of:

a) forming an in-line holographic mask by:

a1) providing an object mask, a recording medium, and a first source of illumination, said object mask having a first side, said recording medium having a first face, said recording medium further comprising a central region;

a2) providing illumination from said first source of illumination to said first side to generate object waves incident on said first face, wherein light transmitted through said object mask provides said object waves incident on said first face;

a3) using illumination from said first source of illumination to generate reference waves incident on said first face so as to interfere with said object waves incident on said first face, wherein said object mask does not shadow said central region of said recording medium from reference waves;

a4) recording an interference pattern of said interfering waves in at least said central region of said recording medium;

b) providing a second source of illumination for generating a reconstruction beam, said reconstruction beam having a reconstruction beam wavelength and reconstruction beam fluence;

c) providing a workpiece; and d) illuminating said recording of said interference pattern with said reconstruction beam so as to impart a real image to the workpiece.

48. A method of imparting an image in a workpiece according to claim 47, wherein said in-line holographic mask is made of a material that is substantially transparent and resistant to damage at said reconstruction beam wavelength and fluence.

* * * * *

UNITED STATES PATENT AND TRADEMARK OFFICE
CERTIFICATE OF CORRECTION

| | |
|---|---|
| PATENT NO. | : 6,618,174 B2 |
| DATED | : September 9, 2003 |
| INVENTOR(S) | : William P. Parker and Julie W. Parker |

It is certified that error appears in the above-identified patent and that said Letters Patent is hereby corrected as shown below:

<u>Column 29,</u>
Line 8, delete the portion of claim 20 beginning with "wherein said in-line holographic mask" to and including "using surface relief patterning of said material,"
Line 13, and insert the following -- wherein said illumination from said first source of illumination comprises a plane wave --

Signed and Sealed this

Seventeenth Day of August, 2004

JON W. DUDAS
*Acting Director of the United States Patent and Trademark Office*